(12) United States Patent
Tobita et al.

(10) Patent No.: US 7,688,298 B2
(45) Date of Patent: Mar. 30, 2010

(54) DIGITAL/ANALOG CONVERSION DEVICE AND DISPLAY DEVICE HAVING THE SAME

(75) Inventors: Youichi Tobita, Hyogo (JP); Yuzo Odoi, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 475 days.

(21) Appl. No.: 11/802,446

(22) Filed: May 23, 2007

(65) Prior Publication Data
US 2007/0216626 A1    Sep. 20, 2007

Related U.S. Application Data

(62) Division of application No. 10/802,771, filed on Mar. 18, 2004, now Pat. No. 7,236,152.

(30) Foreign Application Priority Data

May 28, 2003    (JP)    ............................. 2003-151079

(51) Int. Cl.
*G09G 3/36*    (2006.01)
*G09G 3/30*    (2006.01)

(52) U.S. Cl. ............................. 345/89; 345/100; 345/77

(58) Field of Classification Search ............ 345/76–83, 345/87, 89, 98, 100, 204; 341/144, 150, 341/152, 154
See application file for complete search history.

(56) References Cited

U.S. PATENT DOCUMENTS

| | | | |
|---|---|---|---|
| 6,157,332 A | 12/2000 | Frank et al. | |
| 6,556,176 B1 * | 4/2003 | Okuyama et al. | ............. 345/76 |
| 6,600,435 B2 | 7/2003 | Karube | |
| 6,702,407 B2 * | 3/2004 | Azami | ......................... 305/204 |
| 6,771,200 B2 | 8/2004 | Frulio et al. | |
| 7,136,058 B2 | 11/2006 | Nakamura et al. | |
| 7,212,196 B2 * | 5/2007 | Nakamura et al. | ........... 345/213 |
| 2002/0190971 A1 | 12/2002 | Nakamura et al. | |

FOREIGN PATENT DOCUMENTS

| | | |
|---|---|---|
| EP | 0 604 397 | 6/1994 |
| JP | 05-081875 | 4/1993 |

(Continued)

OTHER PUBLICATIONS

Shirato, Yoshio., et al. "Exhaustive Guide to Analog IC with Illustrations." Tokyo Denki University Press, Nov. 1986, pp. 258-260.

(Continued)

*Primary Examiner*—Jimmy H Nguyen
(74) *Attorney, Agent, or Firm*—McDermott Will & Emery LLP

(57) ABSTRACT

A pulse number control circuit inputs, to a charge pump circuit, pulses of a number according to digital data constituted of weighted data bits. The charge pump circuit includes a pump capacitor connected between a first node to which the pulses are input and a second node, a switch element connected between the second node and an output node, and a bias circuit. According to a change of a voltage on the output node, the bias circuit changes a voltage on the second node with the same polarity.

6 Claims, 20 Drawing Sheets

FOREIGN PATENT DOCUMENTS

| | | |
|---|---|---|
| JP | 06-303142 | 10/1994 |
| JP | 03-504788 | 10/1997 |
| JP | 2002-111499 | 4/2002 |
| JP | 2002-344318 | 11/2002 |
| JP | 2002-344319 | 11/2002 |

OTHER PUBLICATIONS

Japanese Office Action, with English Translation, issued in corresponding Japanese Patent Application No. 2003 151079, mailed on Dec. 11, 2007.

Office Action dated Dec. 27, 2006.

* cited by examiner

DIGITAL/ANALOG CONVERSION DEVICE AND DISPLAY DEVICE HAVING THE SAME

RELATED APPLICATIONS

This application is a divisional application of Ser. No. 10/802,771, filed Mar. 18, 2004, now U.S. Pat. No. 7,236,152 which claims priority of Japanese Patent application Serial No. 2003-151079, filed May 28, 2003, the contents of which are hereby incorporated.

BACKGROUND OF THE INVENTION

1. Field of the Invention

The present invention relates to a digital/analog conversion device converting digital data into an analog voltage as well as a display device indicating a gray level with the analog voltage generated by the digital/analog conversion device.

2. Description of the Background Art

A digital/analog conversion device which converts digital data into analog signals is commonly used. Such a digital/analog conversion device is used, for example, for generating an analog voltage so as to display a gray level (this voltage is hereinafter referred to as "gray-level voltage") on a display device having, for each pixel, such a voltage-driven light-emitting device as a liquid-crystal display device or a current-driven light-emitting device of self-light-emitting type.

The above-described display device can display a gray level by setting the gray-level voltage to a level between the maximum brightness (white) and the minimum brightness (black) for each pixel. In other words, the gray-level voltage is set to one of $2^n$ levels (n is a natural number) according to n-bit digital data and transmitted to each pixel.

One of generally known digital/analog conversion devices is constituted of a plurality of ladder-connected resistance elements (see for example "Exhaustive Guide to Analog IC with Illustrations" by Yoshio Shirato, Tokyo Denki University Press, November 1986, pp. 258-260). Such a ladder-type digital/analog conversion device, however, has a problem that the consumption current increases due to a constantly flowing DC current.

Then, a digital/analog conversion device is disclosed for example in Japanese Patent Laying-Open No. 2002-111499 (hereinafter referred to as "conventional art") that has a charge pump circuit used to charge/discharge a capacitor element and thereby change an output voltage in a stepwise manner.

The digital/analog conversion device of the conventional art that uses the charge pump circuit can reduce its power consumption since no constant DC current is generated therein.

However, regarding the digital/analog conversion device of the conventional art that uses the charge pump circuit, a change in output voltage Vout between a pulse input and an immediately following pulse input varies depending on the level of the output voltage Vout. Specifically, as the output voltage Vout is higher, the change in output voltage per pulse input gradually approaches saturation.

Therefore, in order to set the output voltage Vout in such a manner that the output voltage changes at regular intervals, it would be necessary to control the number of clocks to be input to the charge pump circuit according to the level of the output voltage Vout, possibly resulting in a complicated circuit configuration. It is expected that this problem becomes noticeable when the digital/analog conversion device is employed for generating a gray-level voltage for a display device.

SUMMARY OF THE INVENTION

An object of the present invention is to provide a digital/analog conversion device of low power consumption accomplished by a charge-pump-circuit operation that is configured to allow an output analog voltage to change at regular intervals according to the number of input pulses, and to provide a display device having such a digital/analog conversion device.

A digital/analog conversion device according to the present invention is a digital/analog conversion device outputting an analog voltage according to digital data of a plurality of weighted bits, and includes, a pulse number control circuit supplying, to a first node, pulses of a number according to the digital data, the pulses including a first transition edge changing from an initial level to a predetermined level and a second transition edge returning from the predetermined level to the initial level, and a charge pump circuit changing, in a stepwise manner, each time one of the pulses is supplied to the first node, a voltage on an output node having an output capacitor connected thereto. The charge pump circuit includes a pump capacitor connected between a second node and the first node, a switch element connected between the second node and the output node to be turned on at a timing at which the first transition edge of each of the pulses is transmitted to the first node and turned off at a timing at which the second transition edge thereof is transmitted to the first node, and a bias circuit changing, according to the change of the voltage on the output node, a voltage on the second node with the same polarity as that of the change of the voltage on the output node.

A display device according to the present invention is a display device displaying a gray level based on display data constituted of weighted n bits where n is an integer of at least two, and includes, a plurality of pixel circuits each indicating a brightness according to a supplied voltage, a selection line for selecting the pixel circuits, a data line connected to the pixel circuits, and a gray-level voltage generation circuit for supplying to the data line a gray-level voltage that is an analog voltage according to the display data. The gray-level voltage generation circuit includes a pulse number control circuit supplying, to a first node, pulses of a number according to the display data, the pulses including a first transition edge changing from an initial level to a predetermined level and a second transition edge returning from the predetermined level to the initial level, and a charge pump circuit changing, in a stepwise manner, each time one of the pulses is supplied to the first node, a voltage on an output node connected to the data line.

According to the present invention, a display device with another configuration is a display device displaying a gray level based on display data constituted of weighted n bits where n is an integer of at least two, and includes, a plurality of pixel circuits each having a display element indicating a brightness according to a supplied voltage to the pixel circuit, a data line connected to the pixel circuits, and a gray-level voltage generation circuit for supplying to the data line a gray-level voltage that is an analog voltage according to the display data. The gray-level voltage generation circuit includes a pulse control unit successively receiving pulses including a first transition edge changing from an initial level to a predetermined level and a second transition edge returning from the predetermined level to the initial level, and outputting the pulses or inverted pulses that are inverted versions of the pulses according to a specified bit among the n bits, a pulse number control circuit receiving the pulses or the inverted pulses that are output from the pulse control unit, and transmitting, to a first node, the pulses or the inverted pulses of a number according to the display data, a first charge pump circuit increasing, in a stepwise manner, in response to each of the pulses transmitted to the first node, a voltage on a first output node connected to the data line, and a second charge pump circuit decreasing, in a stepwise manner, in response to each of the inverted pulses transmitted to the first node, a voltage on a second output node connected to the data line.

A chief advantage of the present invention is therefore that the charge pump circuit of a relatively simple configuration of the digital/analog conversion device can be used to generate an analog voltage with low power consumption that changes at regular intervals in a stepwise manner according to digital data of a plurality of weighted bits.

Further, the display device of the present invention can use the charge pump circuit to generate an analog voltage for gray-level display with low power consumption that changes in a stepwise manner according to display data of a plurality of weighted bits.

Moreover, the display device can use the upcharge pump circuit and the downcharge pump circuit that are selectively operated to generate an analog voltage for gray-level display. Then, as compared with such a configuration in which only one of the upcharge and downcharge pump circuits is used, the gray-level voltage can more speedily be generated.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
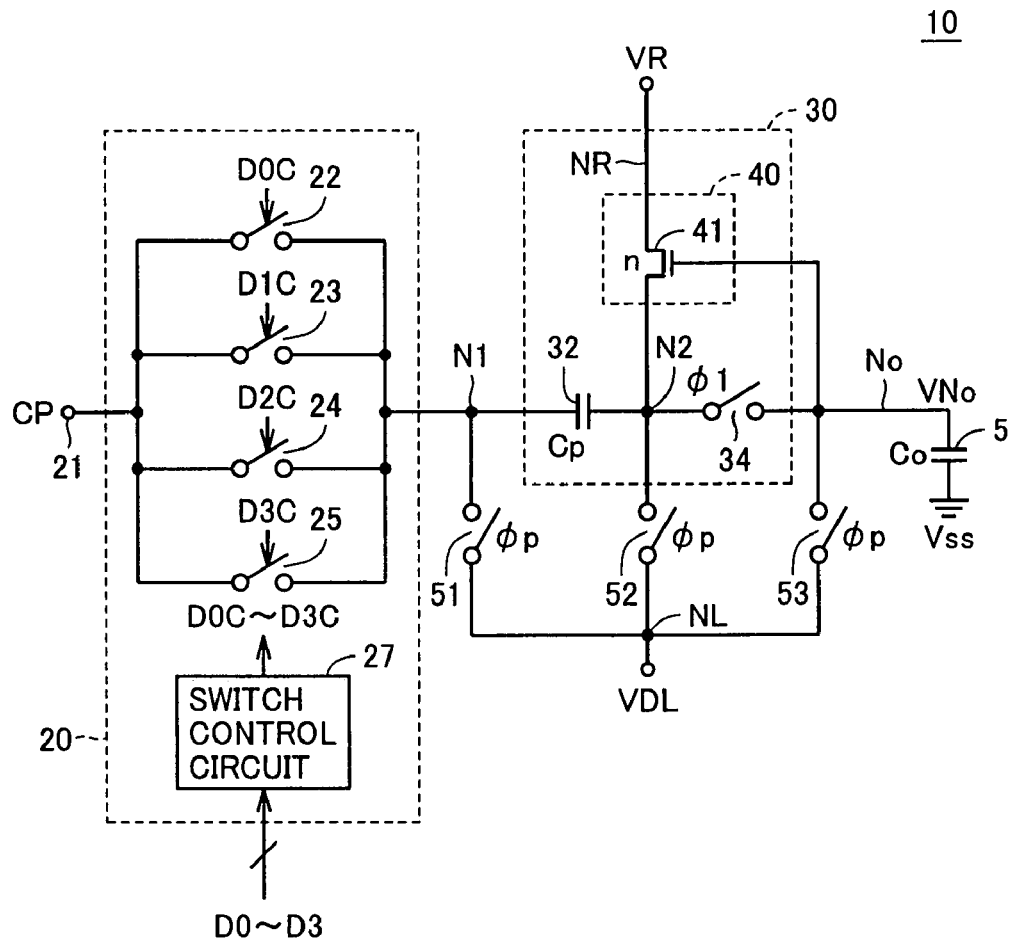
FIG. 1 is a circuit diagram showing a configuration of a digital/analog conversion device according to a first embodiment of the present invention.

Embodiments of the present invention are hereinafter described in detail with reference to the drawings. It is noted that like components are denoted by like reference characters in the following description.

First Embodiment

Referring to FIG. 1, a digital/analog conversion device 10 of a first embodiment includes a pulse number control circuit 20, a charge pump circuit 30, and precharge switches 51-53 serving as a precharge circuit. Digital/analog conversion device 10 generates, according to input digital data, an analog voltage VNo on an output node No to which an output capacitor 5 is connected.

In this embodiment of the present invention, it is supposed that the input digital data has 4 bits, namely the input digital data is constituted of weighted data bits D0-D3 among which data bit D0 is the least significant bit (LSB) and data bit D3 is the most significant bit (MSB), and a description of this embodiment will be given accordingly.

As clearly seen from the following description, the number of bits of input digital data is not limited to the above-described one and the digital/analog conversion device of the present invention may be configured to be adapted to digital data of an arbitrary number of bits.

Pulse number control circuit 20 includes switch elements 22-25 constituting a switch circuit and a switch control circuit 27. Switch elements 22-25 are connected in parallel between a node 21 to which pulses CP are successively supplied and a node N1.

Switch control circuit 27 generates, according to data bits D0-D3, control signals D0C-D3C respectively controlling respective ON periods of switch elements 22-25.

Switch 22 is turned on when control signal D0C has a logical high level (hereinafter simply referred to as "H level") and turned off when control signal D0C has a logical low level (hereinafter simply referred to as "L level"). Similarly, switch elements 23-25 are turned on/off in response to respective control signals D1C-D3C. Switch elements 22-25 in the ON state each transmit pulses CP from node 21 to node N1.

Charge pump circuit 30 includes a pump capacitor 32 connected between nodes N1 and N2, a switch element 34 connected between node N2 and output node No, and a bias circuit 40 provided between a power-supply node NR to which a predetermined voltage VR is applied and node N2.

Switch element 34 is, for example, constituted of a p-type transistor, an n-type transistor or a combination of the p- and n-type transistors connected in parallel to be turned on/off in response to a control signal φ1. Bias circuit 40 has an n-type transistor 41 connected between power-supply node NR and node N2. The gate of n-type transistor 41 is connected to output node No.

Precharge switches 51, 52 and 53 are connected respectively between nodes N1, N2 and output node No and a power-supply node NL to which a predetermined low voltage VDL is applied. Precharge switches 51-53 are each turned on/off in response to a precharge signal φp. Here, it is supposed that low voltage VDL corresponds to the minimum level in a range over which output voltage VNo is controlled that is generated according to input digital data. Predetermined voltage VR is a voltage that is at least higher than low voltage VDL.

Output node No has output capacitor 5 connected between it and a predetermined voltage Vss (typically ground voltage). It is hereinafter supposed that pump capacitor 32 has a capacitance of Cp and output capacitor 5 has a capacitance of Co.

An operation of pulse number control circuit 20 is now described.

Figure 2:
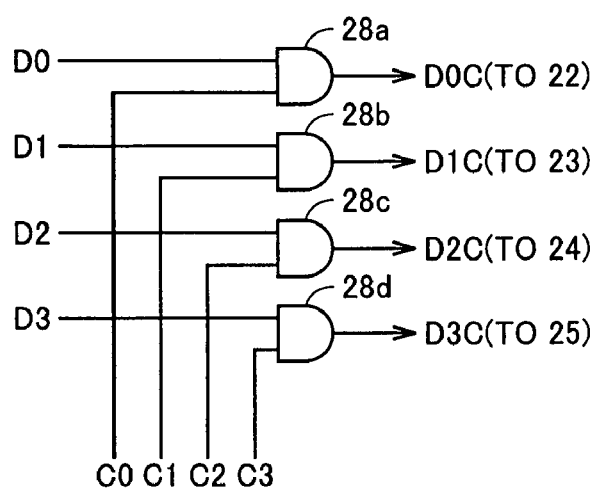
FIG. 2 is a circuit diagram showing a configuration of a switch control circuit shown in FIG. 1.

FIG. 2 is a circuit diagram showing a configuration of switch control circuit 27 shown in FIG. 1.

Referring to FIG. 2, switch control circuit 27 has logic gates 28a-28d generating control signals D0C-D3C respectively. Logic gate 28a generates control signal D0C as a result of an AND logical operation on a control signal C0 and data bit D0, and logic gate 28b generates control signal D1C as a result of an AND logical operation on a control signal C1 and data bit D1. Similarly, logic gate 28c generates control signal D2C as a result of an AND logical operation on a control signal C2 and data bit D2, and logic gate 28d generates control signal D3C as a result of an AND logical operation on a control signal C3 and data bit D3.

Figure 3:
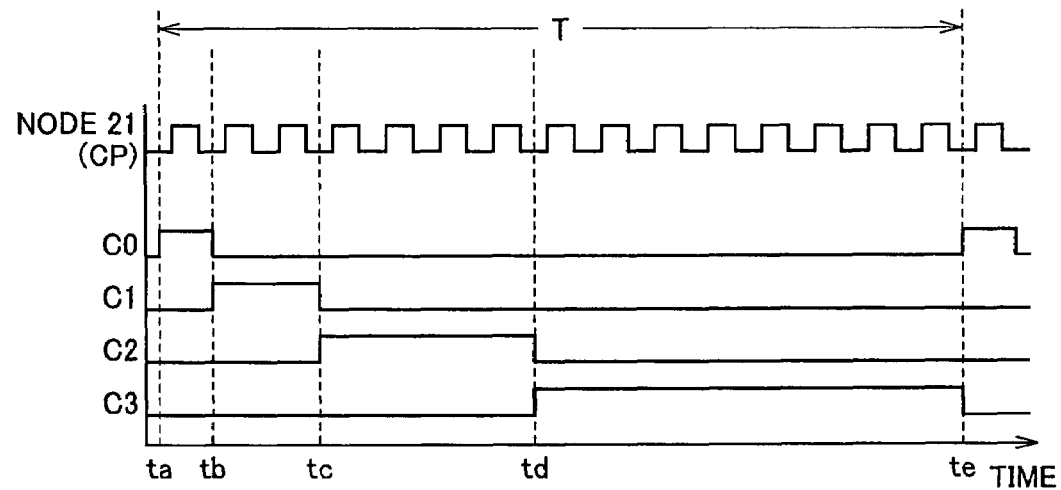
FIG. 3 is an operational waveform chart illustrating an operation of a pulse number control circuit shown in FIG. 1.

FIG. 3 is an operational waveform chart illustrating the operation of pulse number control circuit 20.

Referring to FIG. 3, to node 21 shown in FIG. 1, pulses CP are successively provided including a transition edge from L level to H level (rising edge) and a transition edge from H level to L level (falling edge). As an example, one period T includes ($2^n-1$) pulses CP (15 pulses in FIG. 3) according to the number of bits "n" of a digital signal.

In each period T, control signal C0 corresponding to data bit D0 of the least significant digit is set to H level during the period of time ta-tb containing one pulse CP and is set to L level during the remaining period of time. Similarly, control signal C1 is set to H level during the period of time tb-tc such that the H level period contains two pulses CP and is set to L level during the remaining period of time. Control signal C2 is set to H level during the period of time tc-td such that the H level period contains four pulses CP. Further, control signal C3 corresponding to data bit D3 of the most significant digit is set to H level during the period of time td-te such that the H level period contains eight pulses CP.

Accordingly, in one period T, at the timing at which each pulse CP is transmitted to node 21, one of control signals C0-C3 is set to H level while remaining signals are set to L level. Further, the ratio between respective H level periods of control signals C0-C3 is determined by raising 2 to the power of respective bit weights, namely, the ratio is set to 1:2:4:8.

Thus, in each of the time periods ta-tb, tb-tc, tc-td and td-te, pulse number control circuit 20 shown in FIG. 1 does not transmit pulse CP to node N1 when a corresponding one of data bits D0-D3 is "0" while transmits, if a corresponding one of data bits D0-D3 is "1", the corresponding number of pulses CP according to the H level period of control signals C0-C3.

Thus, for one period T, the number of pulses CP transmitted by pulse number control circuit 20 from node 21 to node N1 is set to "D0+2 D1+4·D2+8·D3 (D0, D1, D2, D3="0" or "1")".

An operation of digital/analog conversion device 10 is now described in connection with FIG. 4.

Figure 4:
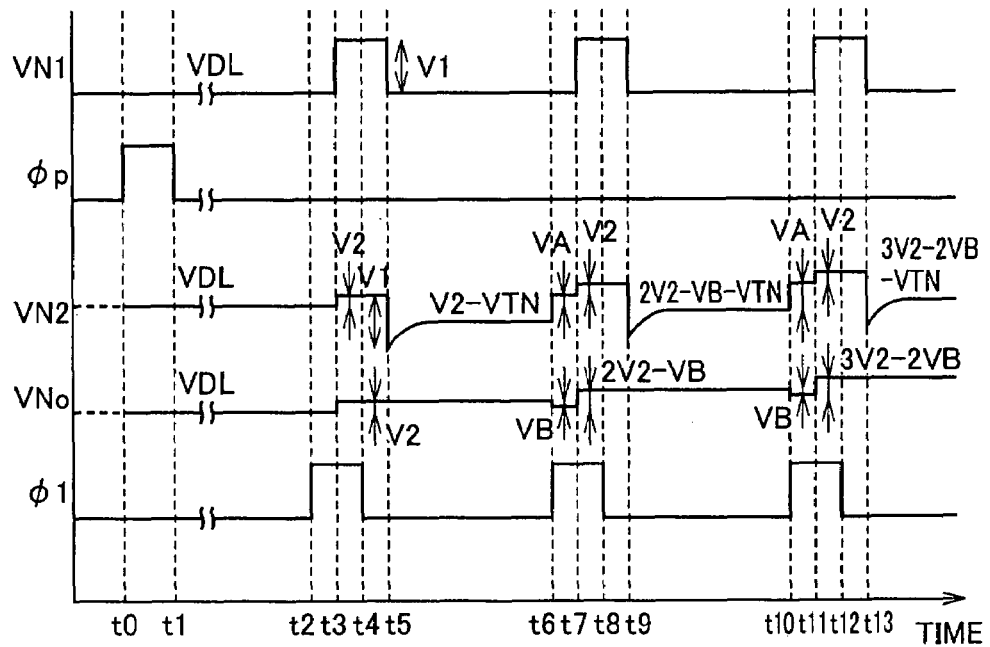
FIG. 4 illustrates an operation of the digital/analog conversion device shown in FIG. 1.

Referring to FIG. 4, before output voltage VNo is output, precharge signal φp is set to H level for a predetermined period of time (t0-t1) so that nodes N1 and N2 and output node No are each precharged to low voltage VDL. Accordingly, a voltage VN1 on node N1, a voltage VN2 on node N2 and output voltage VNo on output node No are set to have a relation VN1=VN2=VNo=VDL. It is hereinafter supposed that the voltage on each node or the like is represented as a voltage with respect to low voltage VDL (i.e., VDL=0 (V)).

In response to transmission of the first pulse CP, voltage VN1 on node N1 increases from low voltage VDL by V1 in the period of time t3-t5. Control signal φ1 is set to H level in the period of time t2-t4 so as to allow switch element 34 to be turned on at the timing at which the rising edge of pulse CP is transmitted to node N1 (time t3) and turned off at the timing at which the falling edge thereof is transmitted thereto (time t5). Switch element 34 is turned on in the H level period of control signal φ1 and turned off in the L level period thereof.

At time t3, the amount V1 by which voltage VN1 increases is transmitted by capacitive coupling through pump capacitor 32 to node N2 and output node No connected by switch element 34. Accordingly, voltages VN2 and VNo each increase by V2. Here, the amount of the voltage increase V2 is represented by Equation (1):

$$V2=V1 \cdot Cp/(Cp+Co) \quad (1).$$

At time t4, control signal φ1 is set to L level so that switch element 34 is turned off. Further, at time t5, in response to transmission of the falling edge of pulse CP to node N1, voltage VN1 decreases by V1. Accordingly, voltage VN2 decreases by V1 because of the capacitive coupling. However, since switch element 34 is in OFF state, output voltage VNo is kept at V2.

In response to the decrease of voltage VN2, n-type transistor 41 constituting bias circuit 40 is turned on. Here, by setting predetermined voltage VR in such a manner that n-type transistor 41 operates in a saturation region, n-type transistor 41 operates in a source-follower mode. Thus, since the gate voltage (i.e., output voltage VNo) of n-type transistor 41 is V2, voltage VN2 on node N2 returns to "V2-VTN". VTN is the threshold voltage of n-type transistor 41. Thus, according to a change of voltage VNo on output node No, bias circuit 40 changes voltage VN2 on node N2 with the same polarity (one of increase and decrease) as that with which the output voltage changes.

In the period of time t7-t9, the following pulse CP is transmitted to node N1 Control signal φ1 is set again to H level in the period of time t6-t8 including a rising edge (time t7) and including no falling edge (time t9).

Before time t6, the voltage on node N2, i.e., VN2 is equal to V2-VTN and output voltage VNo is equal to V2, so that an AC current flows from output node No having a relatively higher potential to node N2 in response to the turning-on of switch element 34 at time t6. Then, voltage VN2 increases by VA while output voltage VNo decreases by VB so that the voltages become equal to each other, i.e., VN2=VNo. The amount of change in voltage, VA and VB, are determined according to capacitances Cp and Co.

Figure 5:
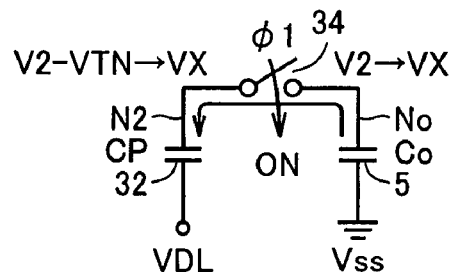
FIG. 5 is a circuit diagram showing an internal state of a charge pump circuit at time t6 and therearound in FIG. 4.

FIG. 5 is a circuit diagram showing an internal state of the charge pump circuit at time t6 and thereabout shown in FIG. 4, specifically, showing respective states of node N2 and output node No.

Referring to FIG. 5, switch element 34 is turned on at time t6 in response to control signal φ1 so that node N2 and output node No reach the same voltage VX. Before and after the turning-on of switch element 34, no charge is supplied/received to/from other circuit elements. Therefore, the charge conservation law is established and voltage VX is represented by Equation (2):

$$Cp \cdot (V2-VTN)+Co \cdot V2=(Cp+Co) \cdot VX \quad (2).$$

From Equation (2), voltage VX is represented by Equation (3):

$$VX = (Cp \cdot V2 + Co \cdot V2 - Cp \cdot VTN)/(Cp + Co) \quad (3)$$
$$= V2 - Cp \cdot VTN/(Cp + Co).$$

Then, the amount of voltage decrease VB of output node No shown in FIG. 4 is represented by Equation (4):

$$VB=Cp \cdot VTN/(Cp+Co) \quad (4).$$

In the period of time t7-t9, a similar charge pump operation is done in response to transmission of the following pulse CP, so that output voltage VNo when the second charge pump operation is finished is equal to $2 \cdot V2-VB$. Further, in the period of time t11-t13, the third pulse CP is transmitted to node N1 and a similar charge pump operation is done accordingly. When the third charge pump operation is finished, output voltage VNo is equal to $3 \cdot V2-2 \cdot VB$.

In this way, output voltage VNo is set, in response to the number m (m is a natural number) of pulses CP transmitted by pulse number control circuit 20 to node N1, as shown by Equation (5):

$$VNo=m \cdot V2-(m-1) \cdot VB \quad (5).$$

The amount of change in voltage ΔV on output node No per pulse CP is thus represented by $\Delta V=V2-VB$ and is a constant value regardless of the level of output voltage VNo.

As discussed above, digital/analog conversion device 10 of the first embodiment can provide output voltage VNo which is proportional to the number of pulses transmitted to charge pump circuit 30 that is determined according to digital data. The digital/analog conversion device of low power consumption and of simple circuit configuration can thus provide an analog voltage that changes at regular intervals in a stepwise manner.

Modification of the First Embodiment

Figure 6:
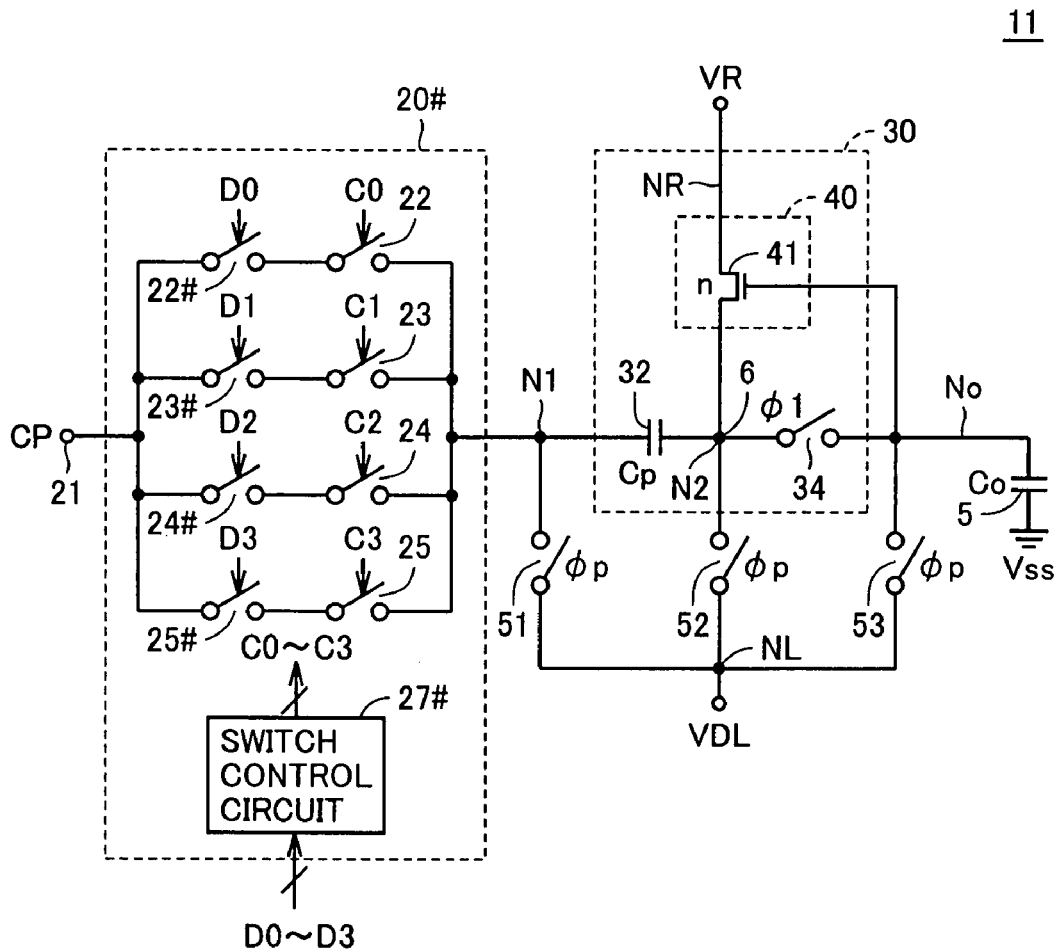
FIG. 6 is a circuit diagram showing a configuration of a digital/analog conversion device according to a modification of the first embodiment.

Referring to FIG. 6, a digital/analog conversion device 11 according to a modification of the first embodiment differs from digital/analog conversion device 10 of the first embodiment shown in FIG. 1 in that the former includes a pulse number control circuit 20# instead of pulse number control circuit 20. The circuit configuration except for this is similar to that of digital/analog conversion device 10 of the first embodiment and the detailed description thereof is not repeated here.

Pulse number control circuit 20# differs from pulse number control circuit 20 shown in FIG. 1 in that the former includes a switch control circuit 27# instead of switch control circuit 27 and additionally includes switch elements 22#-25# connected in series with respective switch elements 22-25 between node 21 and node N1.

Switch control circuit 27# transmits control signals C0-C3 shown in FIG. 3 to switch elements 22-25 respectively and switch elements 22-25 are turned on/off in response to respective control signals C0-C3.

Switch elements 22#-25# are turned on/off in response to respective levels of data bits D0-D3. Specifically, switch elements #22-#25 are each turned on when a corresponding one of data bits D0-D3 is "1" and turned off when the corresponding data bit is "0".

Like pulse number control circuit 20, pulse number control circuit 20# shown in FIG. 6 can be configured to transmit pulses CP of a number according to data bits D0-D3 from node 21 to node N1 and input the pulses to charge pump circuit 30.

The digital/analog conversion device of low power consumption and simple configuration can thus provide an analog voltage changing at regular intervals in a stepwise manner, similarly to that of the first embodiment.

Second Embodiment

Output voltage VNo of the digital/analog conversion devices of the first embodiment and the modification thereof includes, as shown in Equation (4), capacitances Cp and Co and threshold voltage VTN. In usual, capacitances Cp and Co have low temperature dependency and are usually canceled in Cp/(Cp+Co) of Equation (4). On the other hand, threshold voltage VTN has relatively high temperature dependency so that output voltage VNo could vary according to an increase in operating temperature of the digital/analog conversion device. In a second embodiment, a configuration for solving the above-discussed problem is described.

Figure 7:
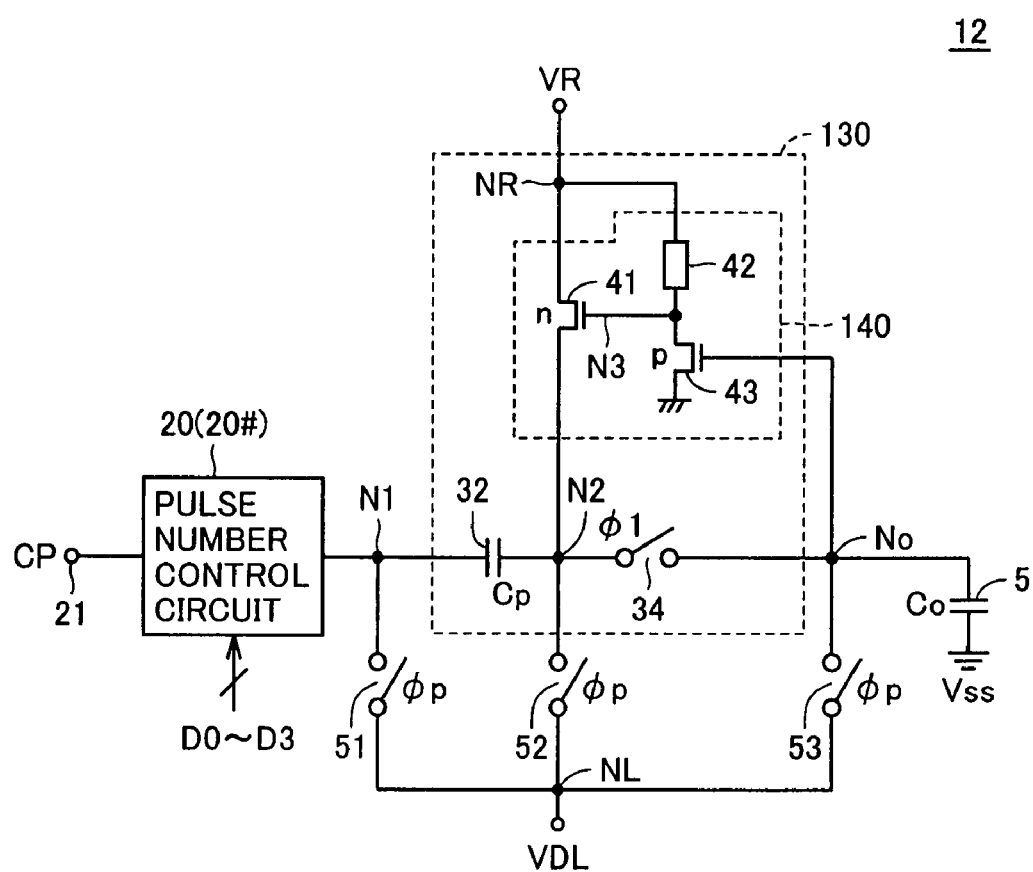
FIGS. 7 and 8 are circuit diagrams showing respective configurations of digital/analog conversion devices according to a second embodiment and a modification thereof of the present invention.

Referring to FIG. 7, a digital/analog conversion device 12 of the second embodiment differs from digital/analog conversion device 10 shown in FIG. 1 in that the former includes a charge pump circuit 130 instead of charge pump circuit 30. Charge pump circuit 130 differs from charge pump circuit 30 in that the former includes a bias circuit 140 instead of bias circuit 40.

Bias circuit 140 includes, in addition to n-type transistor 41, a current-limiting element 42 and a p-type transistor 43. Current-limiting element 42 and p-type transistor 43 are connected in series between power supply nodes respectively receiving voltages different from each other. Although FIG. 7 shows current-limiting element 42 and p-type transistor 43 that are connected between power supply node NR and the ground node, they may be connected between power supply nodes receiving other voltages on the condition that a predetermined operation as discussed below can be accomplished.

The gate of p-type transistor 43 is connected to output node No and a node N3 corresponding to a connection node of current-limiting element 42 and p-type transistor 43 is connected to the gate of n-type transistor 41.

Digital/analog conversion device 12 has its configuration similar to that of digital/analog conversion device 10 shown in FIG. 1 except for the above-described differences, and the detailed description thereof is not repeated here.

Current-limiting element 42 is typically constituted of a resistor element. By setting the resistance value of the resistor element to a value which is sufficiently higher than an on-state resistance value of p-type transistor 43, a voltage VN3 on node N3 can be set as shown by Equation (6) below without substantially increasing power consumption.

$$V3=VNo+|VTP| \quad (6)$$

Here, |VTP| is the absolute value of the threshold voltage of p-type transistor 43. Then, to the gate of n-type transistor 41, a voltage which is higher by |VTP| than output voltage VNo is input. Accordingly, the element (V2−VTN) in Equation (2) is replaced with (V2−VTN+|VTP|). Thus, for the digital/analog conversion device of the second embodiment, voltage VB in Equation (4) is represented by Equation (7):

$$VB = Cp \cdot (VTN - |VTP|)/(Cp + Co) \qquad (7).$$

The effect achieved by manufacturing n-type transistor 41 and p-type transistor 43 through similar manufacturing processes to be located close to each other, i.e., so-called pairing effect, allows respective temperature coefficients of the absolute values of threshold voltages of n-type transistor 41 and p-type transistor 43 to be substantially equal to each other. Then, the temperature dependencies in element (VTN−|VTP|) of Equation (7) are cancelled.

Accordingly, the digital/analog conversion device of the second embodiment can provide, in addition to the effect of the digital/analog conversion device of the first embodiment, the effect of reducing the temperature dependency of the output voltage.

Modification of the Second Embodiment

Figure 8:
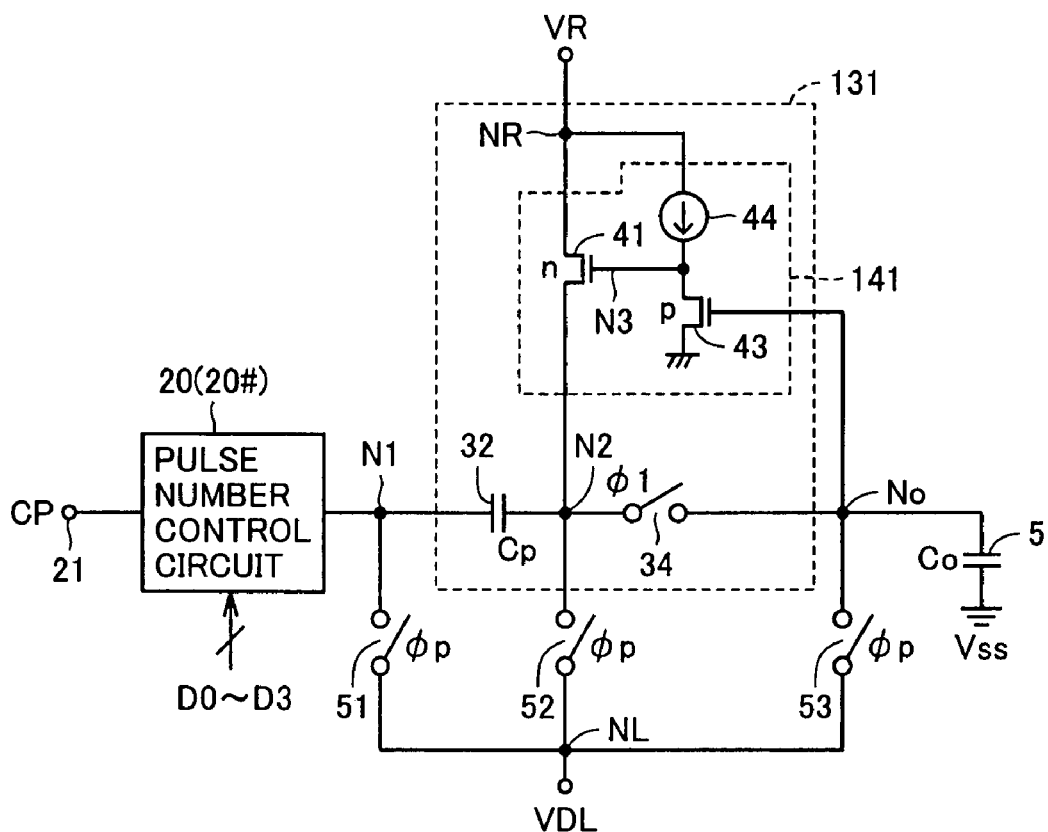

Referring to FIG. 8, a digital/analog conversion device 13 according to a modification of the second embodiment differs from digital/analog conversion device 12 shown in FIG. 7 in that the former includes a charge pump circuit 131 instead of charge pump circuit 130. Charge pump circuit 131 differs from charge pump circuit 130 in that the former includes a bias circuit 141 instead of bias circuit 140.

Bias circuit 141 differs from bias circuit 140 in that current-limiting element 42 is constituted of a constant current source 44. Constant current source 44 supplies a constant small current to node N3 and this small current flows via p-type transistor 43 to the ground node. Then, the voltage on node N3 is set as done in FIG. 7.

In particular, use of constant current source 44 as current-limiting element 42 can keep a constant relation between voltage VN3 on node N3 and output voltage VNo regardless of a voltage difference between node N3 and power supply node NR. In other words, in digital/analog conversion device 12 in FIG. 7 that includes bias circuit 140, the amount of decrease in voltage of current-limiting element 42 could vary depending on output voltage VNo so that the temperature dependency of output voltage VNo is somewhat inferior to that of digital/analog conversion device 13 shown in FIG. 8.

Thus, the digital/analog conversion device of the modification of the second embodiment provides, in addition to the effect of the digital/analog conversion device of the second embodiment, an effect that the amount of stepwise change in output voltage VNo, namely ΔV, can accurately be set by further reducing the temperature dependency.

Third Embodiment

Regarding the digital/analog conversion devices according to the second embodiment and the modification thereof, voltage VB which affects output voltage VNo includes the element (VTN−|VTP|) as seen from Equation (7).

Threshold voltages VTN and |VTP| each of the transistor could vary depending on process variation in manufacturing. If the influence of the variation causes the value determined by (VTN−|VTP|) to vary, the level of output voltage VNo could vary due to the variation of the transistor characteristics (threshold voltages). With a configuration of a third embodiment, the above-described problem is solved and thereby output voltage VNo is more accurately set, as described below.

Figure 9:
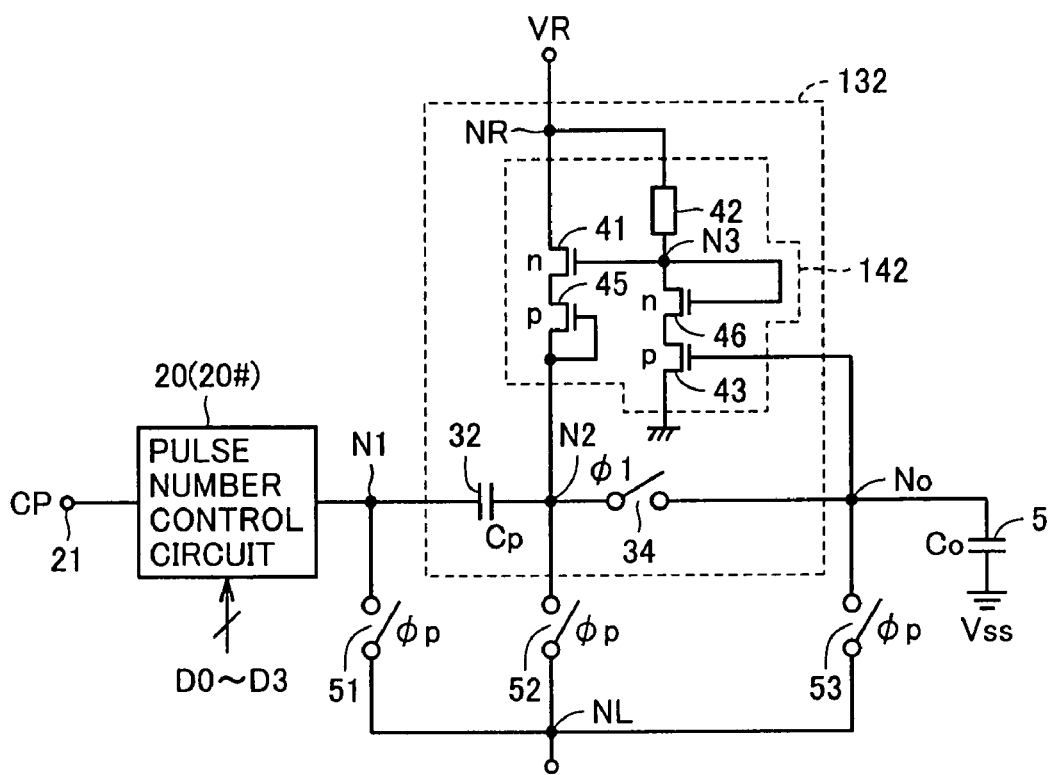
FIGS. 9 and 10 are circuit diagrams showing respective configurations of digital/analog conversion devices according to a third embodiment and a modification thereof of the present invention.

Referring to FIG. 9, a digital/analog conversion device 14 of the third embodiment differs from digital/analog conversion device 12 shown in FIG. 7 in that the former includes a charge pump circuit 132 instead of charge pump circuit 130. Charge pump circuit 132 differs from charge pump circuit 130 in that the former includes a bias circuit 142 instead of bias circuit 140.

Bias circuit 142 differs from bias circuit 140 in that the former further includes a p-type transistor 45 connected between n-type transistor 41 and node N2 and an n-type transistor 46 connected between node N3 and p-type transistor 43. P-type transistor 45 is diode-connected and has its gate connected to node N2. Similarly, n-type transistor 46 is diode-connected and has its gate connected to node N3.

The configuration of digital/analog conversion device 14 is similar to that of digital/analog conversion device 12 shown in FIG. 7 except for the above-described differences and the detailed description thereof is not repeated here.

For bias circuit 142, voltage V3 on node N3 is represented by Equation (8):

$$V3 = VNo + VTN + |VTP| \qquad (8).$$

In other words, a voltage greater than output voltage VNo by VTN+|VTP| is applied to the gate of n-type transistor 41. By connecting the diode-connected p-type transistor 45, the element (V2−VTN) in Equation (2) is now (V2−VTN−|VTP|). Accordingly, the element (V2−VTN) in Equation (2) is replaced with V2 so that VB=0 can be established for Equation (4).

Thus, output voltage VNo of digital/analog conversion device 14 according to the third embodiment is represented by Equation (9) depending only on V2 in Equation (1):

$$VNo = m \cdot V2 \qquad (9).$$

The digital/analog conversion device of the third embodiment accordingly provides, in addition to the effect of the digital/analog conversion device of the first embodiment, an effect that output voltage VNo can more accurately be generated by eliminating the influence of the manufacturing-related variation of the threshold voltages of the transistors. Moreover, since ΔV is easily ensured, the range of the output voltage can be expanded.

Modification of the Third Embodiment

Figure 10:
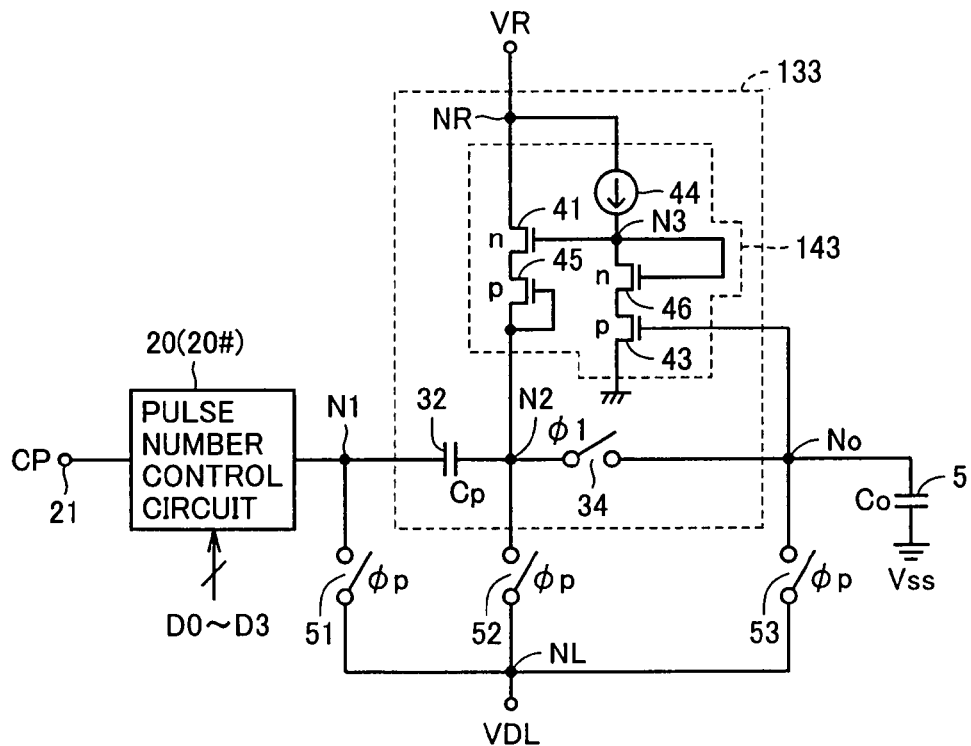

Referring to FIG. 10, a digital/analog conversion device 15 of a modification of the third embodiment differs from digital/analog conversion device 14 shown in FIG. 9 in that the former includes a charge pump circuit 133 instead of charge pump circuit 132. Charge pump circuit 133 differs from charge pump circuit 132 in that the former includes a bias circuit 143 instead of bias circuit 142.

Bias circuit 143 differs from bias circuit 142 shown in FIG. 9 in that the former has current-limiting element 42 constituted of constant current source 44. Constant current source 44 is described above in connection with FIG. 8, and thus the detailed description thereof is not repeated here.

Since constant current source 44 is used as current-limiting element 42, the digital/analog conversion device of the modification of the third embodiment can provide, in addition to the effect of the digital/analog conversion device of the third embodiment, an effect that output voltage VNo can accurately be set by further reducing the temperature dependency.

Although digital/analog conversion devices 11-15 of the second and third embodiments and respective modifications each include pulse number control circuit 20 shown in FIG. 1 and are accordingly described, the digital/analog conversion devices may use pulse number control circuit 20# shown in FIG. 6 instead of pulse number control circuit 20.

Fourth Embodiment

In a fourth embodiment, with regard to digital/analog conversion devices of the first to third embodiments and respective modifications, descriptions are given each of a configuration of a digital/analog conversion device of the opposite polarity, namely, a digital/analog conversion device providing output voltage VNo decreasing in a stepwise manner in response to input of each pulse CP.

Figure 11:
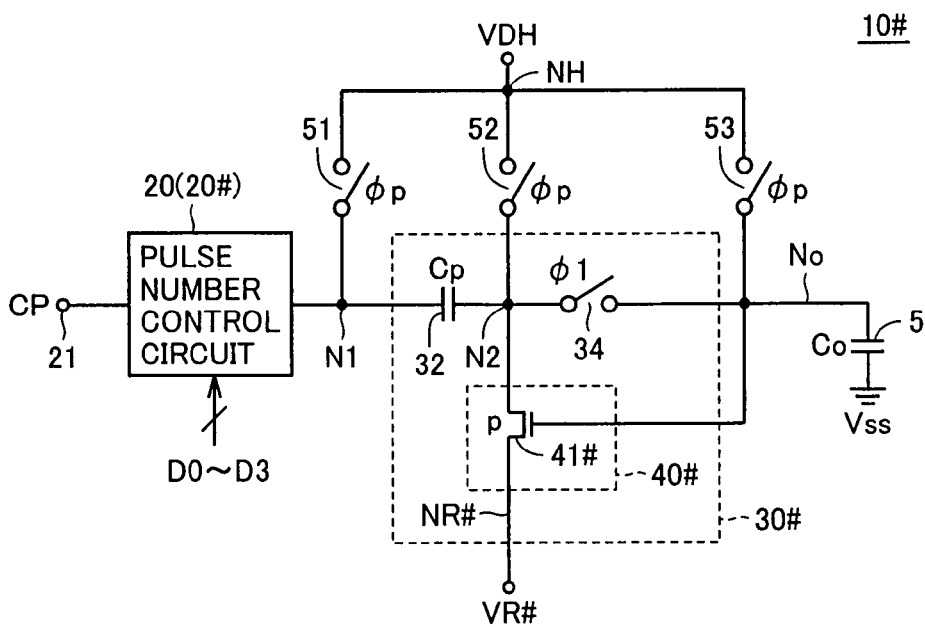
FIGS. 11-15 are circuit diagrams showing respective configurations of digital/analog conversion devices according to first to fifth exemplary configurations of a fourth embodiment.

Referring to FIG. 11, a digital/analog conversion device 10# of a first exemplary configuration of the fourth embodiment has its configuration corresponding to that of digital/analog conversion device 10 shown in FIG. 1 and has the opposite polarity with respect to output voltage VNo.

Digital/analog conversion device 10# includes a pulse number control circuit 20 (or 20#), a charge pump circuit 30# and precharge switches 51-53. Charge pump circuit 30# includes a pump capacitor 32, a switch element 34 and a bias circuit 40#.

Bias circuit 40# includes a p-type transistor 41# connected between a power supply node NR# and a node N2. The gate of p-type transistor 41# is connected to an output node No. Precharge switches 51-53 are connected between a power supply node NH to which a high voltage VDH is supplied and nodes N1 and N2 and output node No respectively, and they are turned on/off in response to a precharge signal φp.

The configuration and operation of pulse number control circuit 20 or #20 are similar to those described in connection with the first embodiment and its modification and the detailed description thereof is not repeated here.

High voltage VDH corresponds to the highest level in a range over which output voltage VNo is controlled that is generated according to input digital data. To a power supply node NR#, a predetermined voltage VR# which is at least lower than high voltage VDH is supplied.

Charge pump circuit 30# operates in a manner of the opposite polarity to that represented by the operational waveform shown in FIG. 4. Each time one pulse CP is transmitted to node N1, charge pump circuit 30# decreases output voltage VNo in a stepwise manner by ΔV in response to the falling edge of pulse CP.

Accordingly, digital/analog conversion device 10# of the fourth embodiment has a similar effect to that of the digital/analog conversion device 10 shown in FIG. 1 and can further generate an analog voltage changing at regular intervals in a stepwise manner according to digital data.

Figure 12:
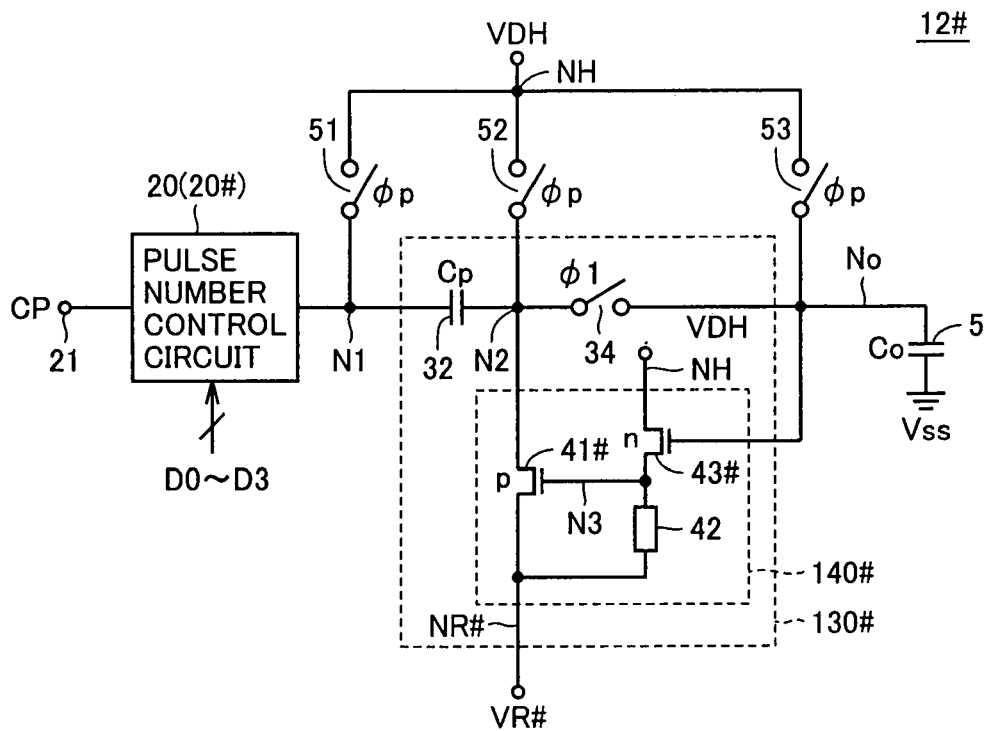

Referring to FIG. 12, a digital/analog conversion device 12# of a second exemplary configuration of the fourth embodiment differs from digital/analog conversion device 10# shown in FIG. 11 in that the former includes a charge pump circuit 130# instead of charge pump circuit 30#. Charge pump circuit 130# differs from charge pump circuit 30# in that the former includes a bias circuit 140# instead of bias circuit 40#.

Bias circuit 140# includes, in addition to p-type transistor 41#, a current-limiting element 42 and an n-type transistor 43#. Current-limiting element 42 and n-type transistor 43# are connected in series between power supply nodes receiving respective voltages different from each other. Although current-limiting element 42 and n-type transistor 43# in FIG. 12 are connected between power supply node NR# and power supply node NH, they may be connected to power supply nodes to which other voltages are supplied.

The configuration of digital/analog conversion device 12# is similar to that of digital/analog conversion device 10# shown in FIG. 11 except for the above described differences and the detailed description thereof is not repeated here.

In other words, digital/analog conversion device 12# is configured correspondingly to digital/analog conversion device 12 shown in FIG. 7 and has the opposite polarity with respect to output voltage VNo. Thus, digital/analog conversion device 12# of the fourth embodiment has a similar effect to that of digital/analog conversion device 12 of the second embodiment and can generate an analog voltage that changes at regular intervals in a stepwise manner according to digital data.

Figure 13:
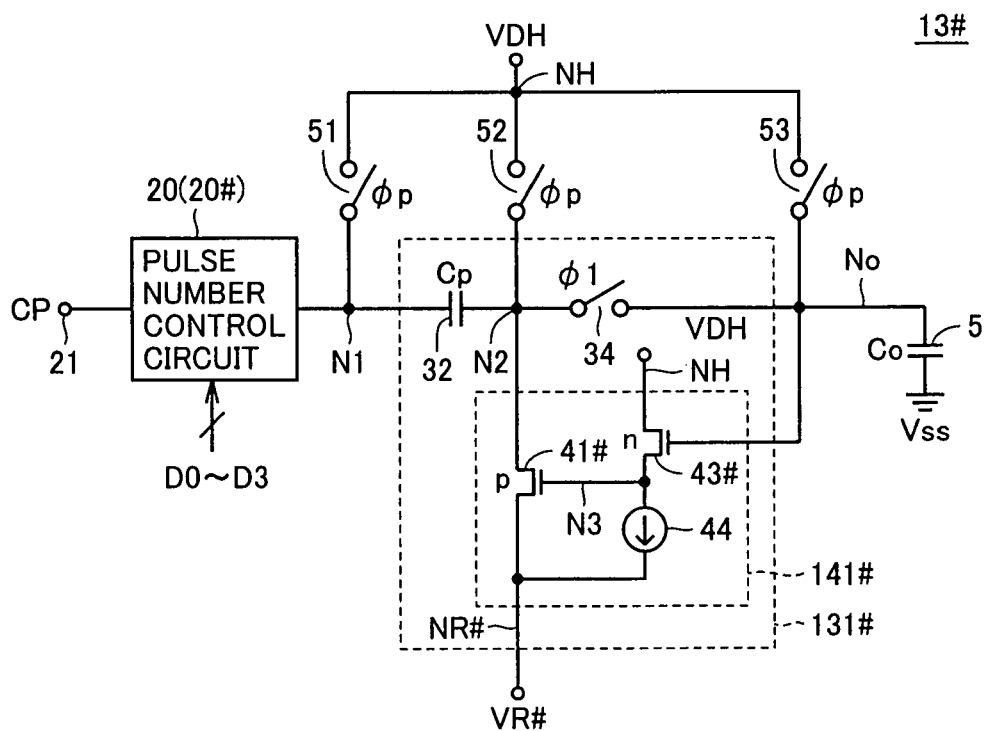

Referring to FIG. 13, a digital/analog conversion device 13# of a third exemplary configuration of the fourth embodiment differs from digital/analog conversion device 12# shown in FIG. 12 in that the former includes a charge pump circuit 131# instead of charge pump circuit 130#. Charge pump circuit 131 # differs from charge pump circuit 130# in that the former includes a bias circuit 141 # instead of bias circuit 140#. Bias circuit 141# differs from bias circuit 140# shown in FIG. 12 in that current-limiting element 42 is constituted of constant current source 44.

In other words, digital/analog conversion device 13# is configured correspondingly to digital/analog conversion device 13 shown in FIG. 8 and has the opposite polarity with respect to output voltage VNo. Namely, differences between digital/analog conversion devices #12 and #13 are similar to those between digital/analog conversion devices 12 and 13. Therefore, digital/analog conversion device 13# can provide, like digital/analog conversion device 13 of the modification of the second embodiment, in addition to the effect of digital/analog conversion device 12# shown in FIG. 12, an effect that output voltage VNo can accurately be set by further reducing the temperature dependency.

Figure 14:
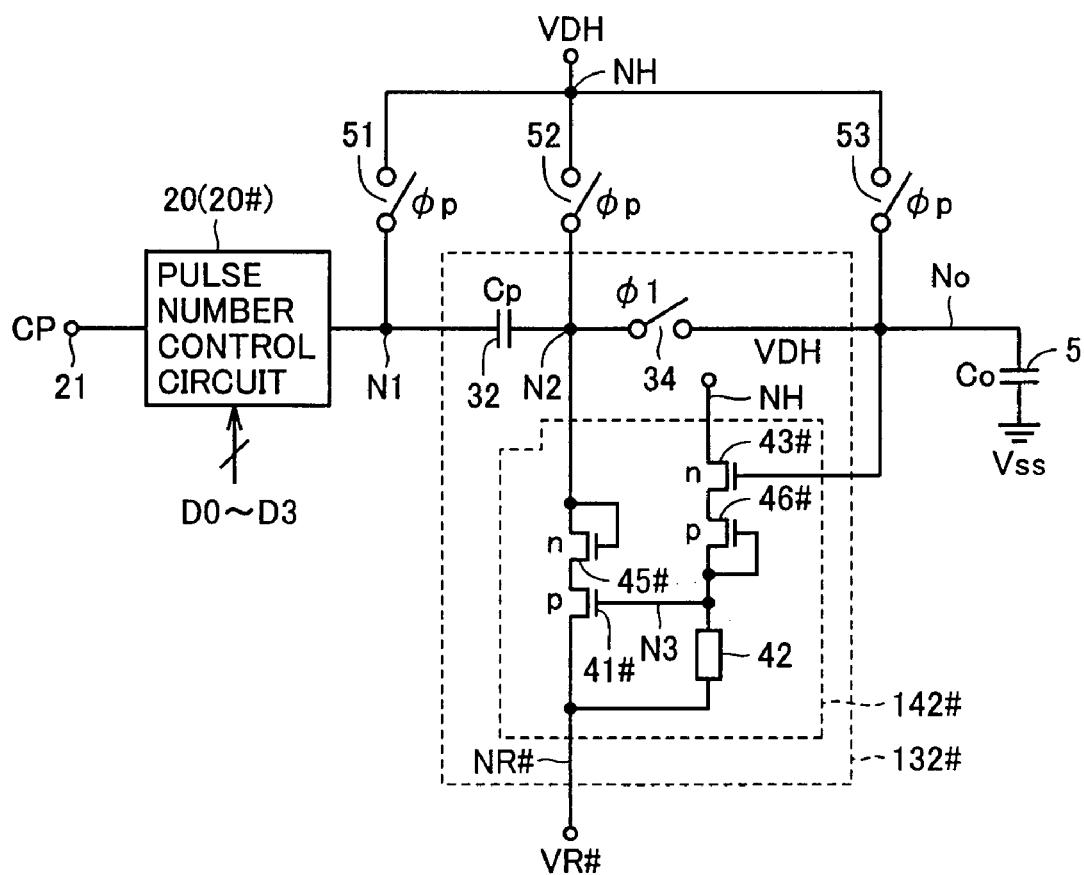

Referring to FIG. 14, a digital/analog conversion device 14# of a fourth exemplary configuration of the fourth embodiment differs from digital/analog conversion device 12# shown in FIG. 12 in that the former includes a charge pump circuit 132# instead of charge pump circuit 130#. Charge pump circuit 132# differs from charge pump circuit 130# in that the former includes a bias circuit 142# instead of bias circuit 140#.

Bias circuit 142# differs from bias circuit 140# shown in FIG. 12 in that the former further includes an n-type transistor 45# connected between p-type transistor 41# and node N2 and a p-type transistor 46# connected between node N3 and n-type transistor 43#. N-type transistor 45# is diode-connected and has its gate connected to node N2. Similarly, p-type transistor 46# is diode-connected and has its gate connected to node N3.

Digital/analog conversion device 14# has its configuration similar to that of digital/analog conversion device 12# shown in FIG. 12 except for the above-described differences, and the detailed description thereof is not repeated here. In other words, digital/analog conversion device 14# is configured correspondingly to digital/analog conversion device 14 shown in FIG. 9 and has the opposite polarity with respect to output voltage VNo.

Thus, like digital/analog conversion device 14 of the third embodiment, digital/analog conversion device 14# provides, in addition to the effect of digital/analog conversion device 10# in FIG. 11, an effect that output voltage VNo can more accurately be generated by eliminating the influence of the manufacturing-related variation of the threshold voltages of the transistors. Further, since ΔV can easily be ensured, the range of the output voltage can be expanded.

Figure 15:
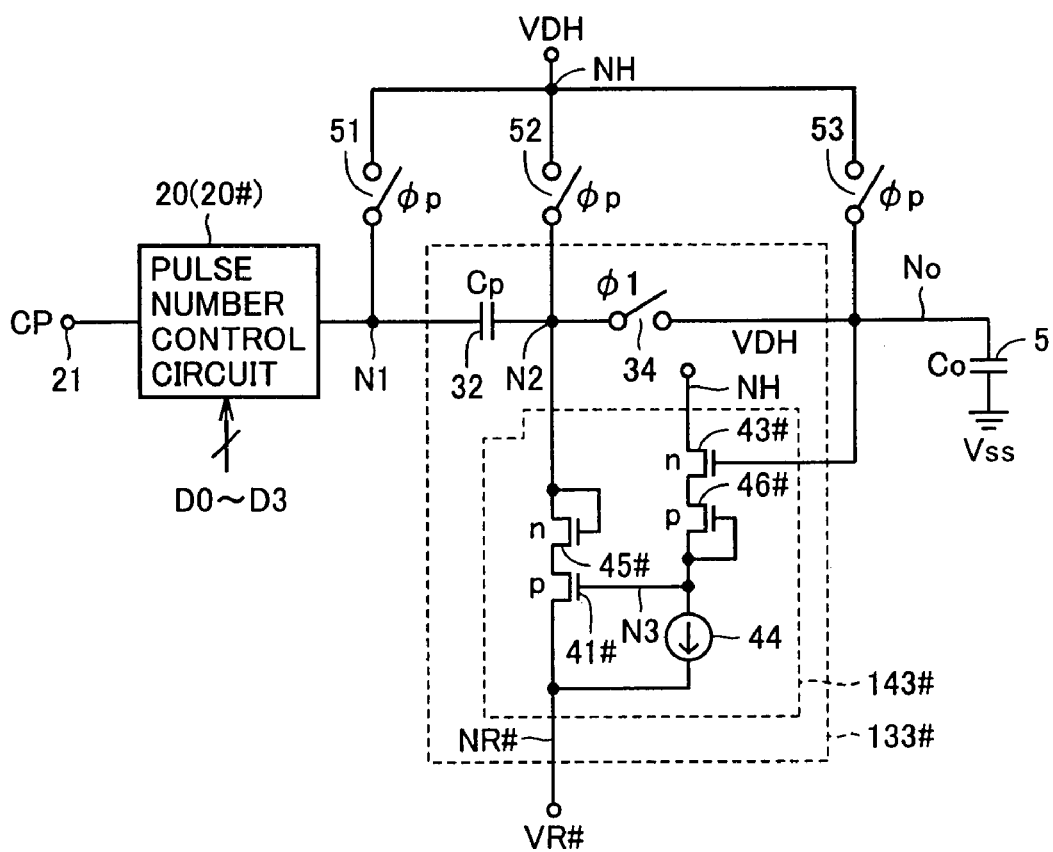

Referring to FIG. 15, a digital/analog conversion device 15# of a fifth exemplary configuration of the fourth embodiment differs from digital/analog conversion device 14# shown in FIG. 14 in that the former includes a charge pump circuit 133# instead of charge pump circuit 132#. Charge pump circuit 133# differs from charge pump circuit 132# in that the former includes a bias circuit 143# instead of bias circuit 142#. Bias circuit 143# differs from bias circuit 142# shown in FIG. 12 in that current-limiting element 42 is constituted of constant current source 44.

In other words, digital/analog conversion device 15# is configured correspondingly to digital/analog conversion device 15 shown in FIG. 10 and has the opposite polarity with respect to output voltage VNo. Namely, differences between digital/analog conversion devices 14# and 15# are similar to those between digital/analog conversion devices 14 and 15. Therefore, digital/analog conversion device 15# provides, like digital/analog conversion device 15 of the modification of the third embodiment, in addition to the effect of digital/analog conversion device 14# in FIG. 14, an effect that output voltage VNo can more accurately be set by further reducing the temperature dependency.

Fifth Embodiment

Regarding the digital/analog conversion devices of the first to third embodiments and respective modifications as well as the fourth embodiment, the level of output voltage VNo is influenced by capacitor value Cp of the pump capacitor and capacitor value Co of the output capacitor. Then, in order to precisely set output voltage VNo, it is preferable that these capacitor values Cp and Co are adjustable.

Figure 16:
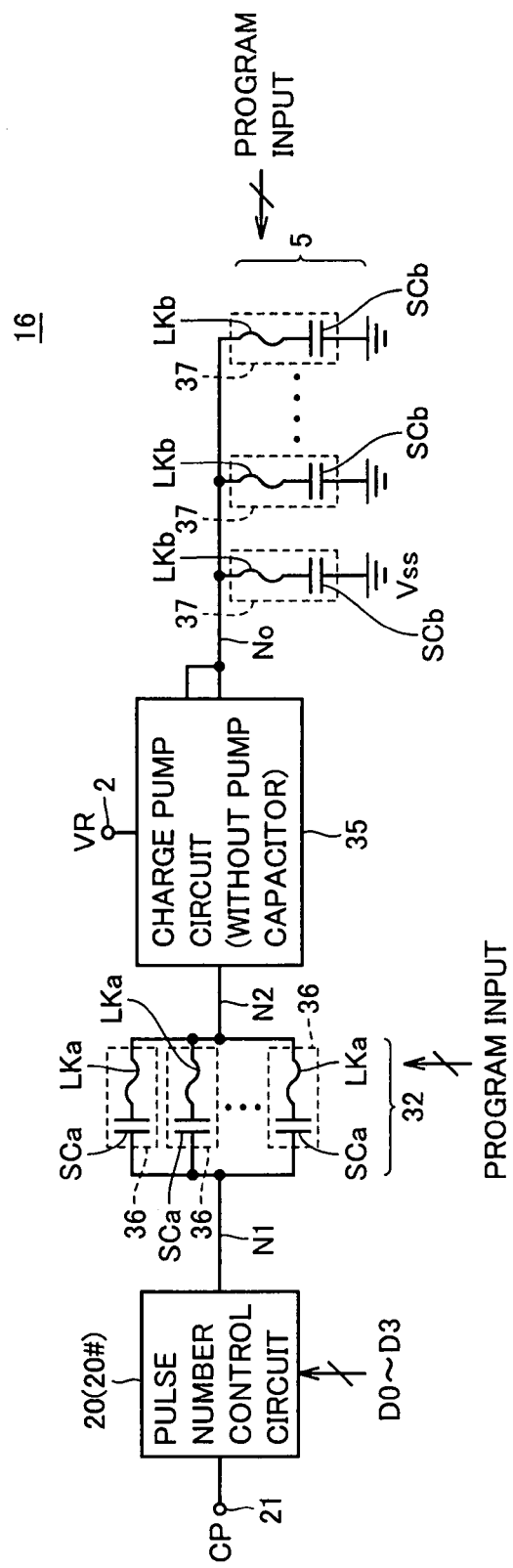
FIG. 16 is a circuit diagram showing a configuration of a digital/analog conversion device according to a fifth embodiment.

Referring to FIG. 16, a digital/analog conversion device 16 of a fifth embodiment includes a pulse number control circuit 20 (or 20#) as well as a pump capacitor 32 and a circuit block 35 that constitute a charge pump circuit, and generates, on an output node No to which an output capacitor 5 is connected, output voltage VNo which is an analog voltage generated according to input digital data. Circuit block 35 generally represents a circuit portion corresponding to any of the above-described charge pump circuits 30 and 131-133 (or 30# and 131#-133#) without pump capacitor 32.

In the configuration of the fifth embodiment, pump capacitor 32 and output capacitor 5 are each configured to be finely adjustable in response to an external input. Pump capacitor 32 includes a plurality of adjustment units 36 connected in parallel between nodes N1 and N2. Adjustment units 36 each include a unit capacitor SCa and a link element LKa connected in series between nodes N1 and N2.

Similarly, output capacitor 5 includes a plurality of adjustment units 37 connected in parallel between a predetermined voltage Vss and output node No. Adjustment units 37 each include a unit capacitor SCb and a link element LKb connected in series between predetermined voltage Vss and output node No.

In response to a program input from the outside of adjustment units 36, link elements LKa each can independently select whether or not to establish an electrical path including its correlated unit capacitor SCa between nodes N1 and N2. Similarly, in response to a program input from the outside of adjustment units 37, link elements LKb each can independently select whether or not to establish an electrical path including its correlated unit capacitor SCb between output node No and predetermined voltage Vss.

As link elements LKa and LKb each, a laser fuse may be employed that is blown in response to laser radiation given as a program input, or an electric fuse may be employed that is blown in response to a high voltage applied as a program input, for example. Alternatively, the link element may be constituted of an antifuse element changing from a nonconductive state to a conductive state in response to a high voltage applied as a program input for breaking an insulating film.

The digital/analog conversion device of the fifth embodiment is thus configured to adjust in a stepwise manner capacitance Cp of pump capacitor 32 and capacitance Co of output capacitor 5 that influence the level of output voltage VNo. Accordingly, a more accurate analog voltage can be generated by a fine adjustment of the level of output voltage VNo.

Sixth Embodiment

According to a sixth embodiment, a description is given of a configuration for providing a gray-level voltage for a display device by means of the digital/analog conversion devices using the charge pump operation as described in connection with the first to fifth embodiments and respective modifications.

Figure 17:
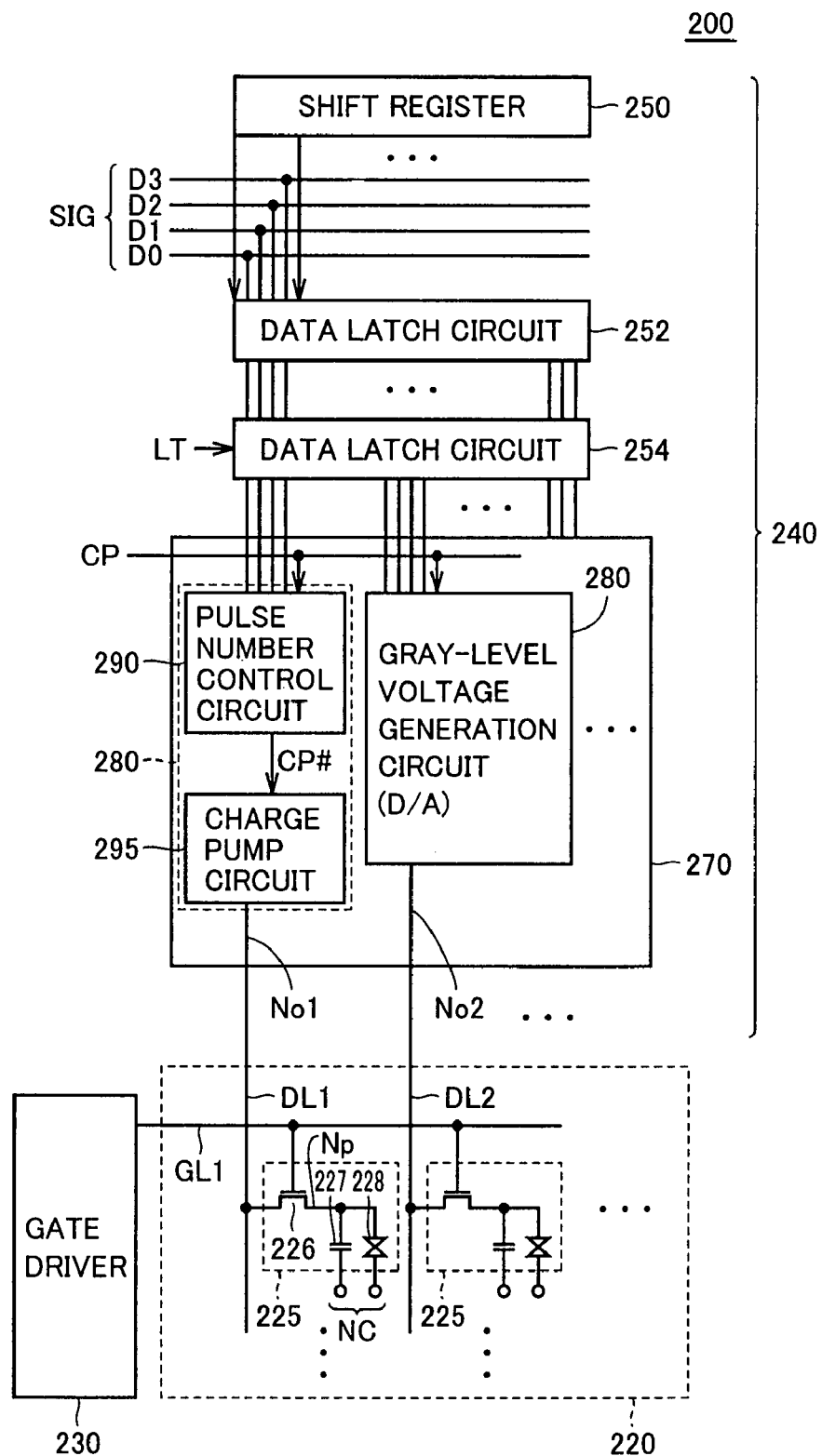
FIG. 17 is a block diagram showing an entire configuration of a display device according to a sixth embodiment.

FIG. 17 is a block diagram showing an entire configuration of a display device according to the sixth embodiment.

Referring to FIG. 17, display device 200 of the sixth embodiment includes a display panel unit 220, a gate driver 230 and a source driver 240. Although the display device shown in FIG. 17 is configured to integrate gate driver 230 and source driver 240 with display panel unit 220, the drivers may be provided as external circuits of display panel unit 220.

Display panel unit 220 includes a plurality of pixel circuits 225 arranged in rows and columns. Gate lines GL are arranged correspondingly to the rows of the pixel circuits (hereinafter referred to as "pixel row(s)"), and data lines DL are arranged correspondingly to the columns of the pixel circuits (hereinafter referred to as "pixel column(s)"). FIG. 17 representatively shows pixel circuits of a first row and first and second columns and corresponding gate line GL1 and data lines DL1 and DL2.

Pixel circuits 225 each include a switch element 226 provided between its corresponding data line DL and a pixel node Np, a holding capacitor 227 and a liquid-crystal display element 228 connected in parallel between pixel node Np and a common electrode node NC. According to a voltage difference between pixel node Np and common electrode node NC, the orientation of liquid-crystal molecules in liquid-crystal display element 228 changes. In response to this change, the brightness of display of liquid-crystal display element 228 changes. Thus, according to a display voltage written to pixel node Np via data line DL and switch element 226, the brightness of each pixel circuit can be controlled. Switch element 226 is constituted, for example, of an n-type transistor.

Gate driver 230 activates gate lines GL one by one based on a predetermined cycle. The gate of switch element 226 is connected to its corresponding gate line GL. Thus, in a period during which the corresponding gate line GL is activated (H level), pixel node Np is connected to its corresponding data line DL. Switch element 226 is generally constituted of a TFT formed on an insulating substrate (e.g. glass substrate, resin substrate) on which liquid-crystal element 228 is also formed. The display voltage transmitted to pixel node Np is transmitted by holding capacitor 227.

Figure 18:
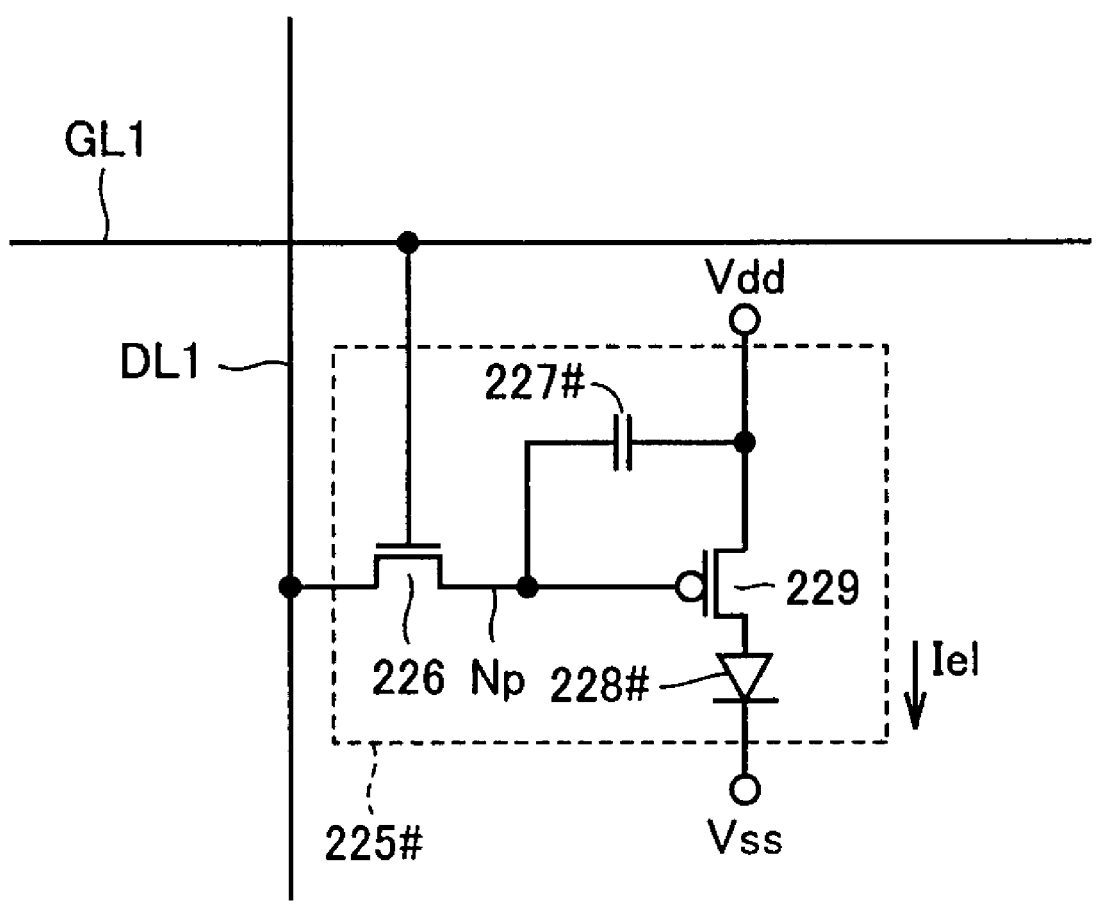
FIG. 18 is a circuit diagram showing an exemplary configuration of a pixel circuit including an EL element.

Alternatively, pixel circuit 225 in FIG. 17 may be replaced with a pixel circuit 225# including a current-driven type light-emitting element shown in FIG. 18.

Referring to FIG. 18, pixel circuit 225# includes a switch element 226, a holding capacitor 227#, an EL (Electro-Luminescence) element 228# which is a typical example of the current-driven type light-emitting element, and a current drive transistor 229. As in pixel circuit 255, switch element 226 is provided between its corresponding data line DL and pixel node Np and has its gate connected to its corresponding gate line GL. Holding capacitor 227# is connected between pixel node Np and voltage Vdd. EL element 228# and current drive transistor 229 are connected in series between voltage Vdd and voltage Vss. Current drive transistor 229 is, for example, constituted of a p-type TFT. Generally, switch element 226 and current drive transistor 229 are formed on the same insulating substrate on which EL element 228# is also formed.

Switch element 226 connects, in a period during which its corresponding gate line GL is activated (H level), pixel node Np to data line DL. Accordingly, a display voltage on data line DL is transmitted to pixel node Np. The voltage on pixel node Np is held by holding capacitor 227#.

Current drive transistor 229 has its gate connected to pixel node Np and supplies, to EL element 228#, a current Ie1 according to the voltage on pixel node Np, namely the display voltage (gray-level voltage) transmitted from the data line. The display brightness of EL element 228# changes according to supplied pass current Ie1. Thus, with pixel circuit 225# as well, the display voltage to be applied to the pixel circuit can be set in a stepwise manner so that the brightness of the EL element represents a gray level.

It will be clearly understood from the following description that the sixth embodiment is directed to peripheral circuitry that generates a display voltage (gray-level voltage) to be supplied to each pixel circuit. Therefore, the present invention is applicable to any display device having pixel circuits each indicating a brightness according to the gray-level voltage, without restrictions on the configuration of the pixel circuits.

Referring again to FIG. 17, source driver 240 outputs, to data line DL, a display voltage which is set in a stepwise manner by display data SIG of n bits. The sixth embodiment is also described by taking an example that n is 4 (n=4), namely display data SIG is constituted of data bits D0-D3. In the sixth embodiment as well, it is supposed that data bit D0 is the least significant bit (LSB) and data bit D3 is the most significant bit (MSB). Then, display device 200 of the sixth embodiment can display $2^4=16$ gray levels by each pixel circuit according to display data SIG of 4 bits.

Source driver 240 includes a shift register 250, data latch circuits 252 and 254 and a display-voltage generation circuit 270.

Display data SIG is generated serially according to the display brightness of each pixel circuit 225. In other words, data bits D0-D3 at a certain timing represent the display brightness of one pixel circuit 225 within display panel unit 220. Shift register 250 instructs data latch circuit 252 to take data bits D0-D3 at a timing in synchronization with a predetermined cycle based on which generating of display data SIG is changed. Data latch circuit 252 successively takes and holds display data SIG corresponding to one pixel row that is generated serially.

At a timing at which display data SIG corresponding to one pixel row is taken by data latch circuit 252, the group of display data latched by data latch circuit is transmitted to data latch circuit 254 in response to activation of a latch signal LT.

Display-voltage generation circuit 270 includes gray-level voltage generation circuits 280 provided correspondingly to respective data lines DL. Gray-level voltage generation circuits 280 each output, to output node No, a gray-level voltage obtained by digital-analog conversion of corresponding data bits D0-D3 held in data latch circuit 254, as a display voltage. Output node No of each gray-level voltage generation circuit is connected to a corresponding data line DL. For example, output nodes No1 and No2 of gray-level voltage generation circuits 280 provided correspondingly to respective data lines DL1 and DL2 shown in FIG. 17 are connected to data lines DL1 and DL2 respectively.

Gray-level voltage generation circuits 280 each include a pulse number control circuit 290 and a charge pump circuit 295. As pulse number control circuit 290, any of pulse number control circuits 20 and 20# shown respectively in FIGS. 1 and 6 for example may be employed. The pulse number control circuit receives successively provided pulses CP and then inputs pulses CP# of a number according to corresponding data bits D0-D3 to charge pump circuit 295. In other words, the number of pulses CP# that are input to charge pump circuit 295 is set according to a value obtained by performing digital-analog conversion on data bits D0-D3.

In response to each input of pulses CP# from pulse number control circuit 290, charge pump circuit 295 changes the voltage on output node No in a stepwise manner. As charge pump circuit 295, any of charge pump circuits 30 and 131-133 as well as charge pump circuits 30# and 131#-133# described in connection with the first to fifth embodiments and respective modifications may be employed.

With this configuration, a display voltage for displaying a gray level can be generated by using the charge pump circuit with low power consumption. In particular, any of the charge pump circuits of the first to fifth embodiments and respective modifications may be used as charge pump circuit 295 to precisely generate the gray-level voltage. Alternatively, depending on the precision with which a required gray-level voltage is set or the circuit area, any charge pump circuit having a common configuration without the arrangement of the bias circuits described in connection with the first to fifth embodiments and respective modifications may be applied.

However, particularly for a display device having liquid-crystal display elements as respective pixel circuits (hereinafter referred to as "liquid-crystal display device"), it is necessary to address the issue of the temperature dependency of a parasitic capacitance of data line DL corresponding to the output capacitor of the charge pump circuit.

Figure 19:
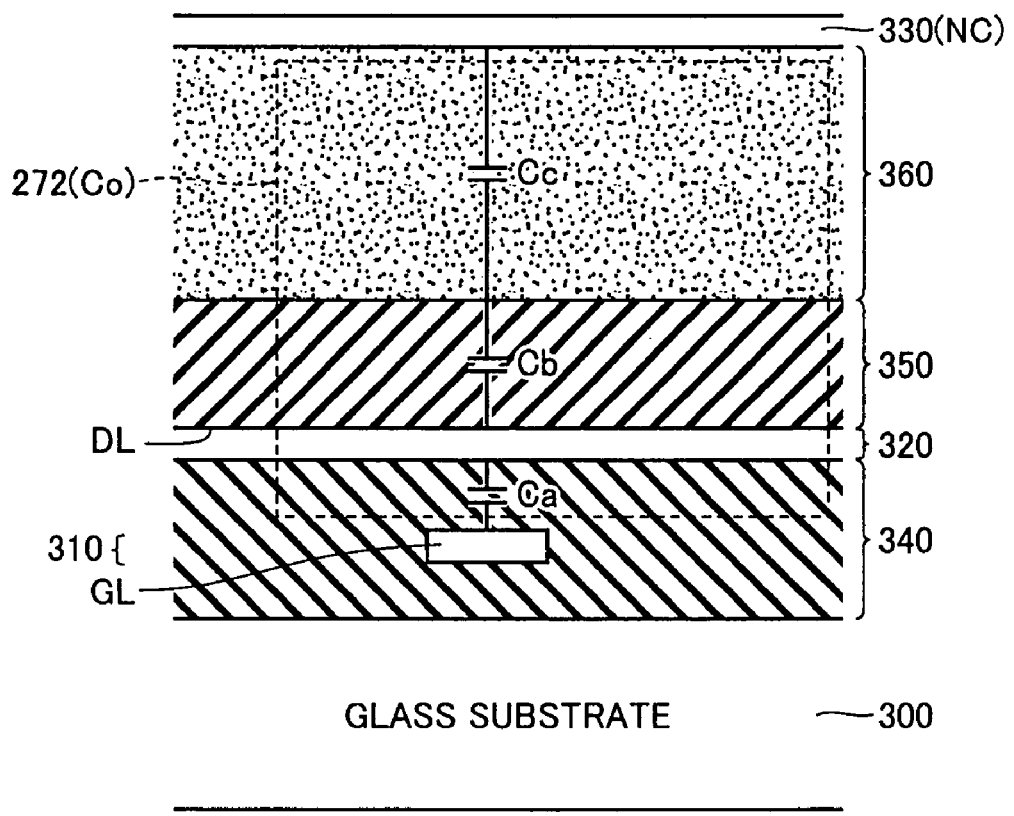
FIG. 19 is a cross-sectional view illustrating a parasitic capacitance of a data line that is an output capacitor of a charge pump circuit in a liquid-crystal display device.

FIG. 19 is a cross-sectional view illustrating a parasitic capacitance of a data line that is an output capacitor of a charge pump circuit in a liquid-crystal display device.

Referring to FIG. 19, the liquid-crystal display device is formed on a glass substrate 300 which is a typical example of an insulating substrate. On glass substrate 300, an insulating layer 340, a metal interconnection layer 320, an insulating layer 350 and a liquid-crystal layer 360 are deposited in this order and a common electrode 330 is provided on the upper surface of liquid-crystal layer 360. Data line DL shown in FIG. 17 is provided in metal interconnection layer 320. Data line DL is typically formed of an aluminum interconnection. Common electrode 330 corresponds to common electrode node NC shown in FIG. 17.

Since gate line GL shown in FIG. 17 is used as a gate electrode of the TFT (not shown) formed on glass substrate 300, gate line GL is formed in a metal interconnection layer 310 provided in the middle of insulating layer 340. Gate line GL is typically formed of an aluminum interconnection.

Here, capacitor Ca corresponds to a parasitic capacitance between data line DL and gate line GL and capacitors Cb and Cc correspond respectively to parasitic capacitances in insulating layer 350 and liquid-crystal layer 360 between data line DL and common electrode 330. Then, the parasitic capacitance of data line DL, namely output capacitor Co of the charge pump circuit, is represented by the sum of capacitances of capacitors Cb and Cc connected in series and capacitor Ca.

Capacitors Ca and Cb in the insulating layers have almost no temperature dependency while capacitor Cc in the liquid-crystal layer varies depending on temperature. Therefore, the output capacitor (Co) of the charge pump circuit has temperature dependency.

Accordingly, as seen from Equations (1) and (4) above, output voltage VNo of the charge pump circuit, namely the gray-level voltage supplied to the pixel circuit varies depending on temperature.

Then, for the display device of the sixth embodiment, a pump capacitor in the charge pump circuit, for example, pump capacitor 32 in the charge pump circuits as described in connection with the first to fifth embodiments and respective modifications, is formed in a similar manner to that in which the peripheral region of data line DL is configured as detailed below so as to reduce the variation of the gray-level voltage.

Figure 20:
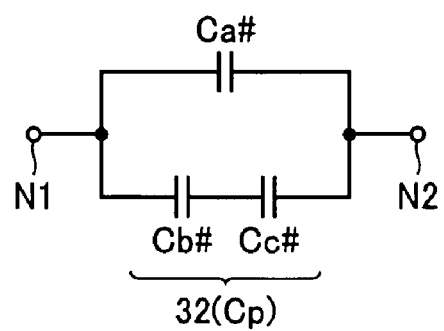
FIG. 20 conceptually shows how a pump capacitor of the sixth embodiment is formed.

FIG. 20 conceptually shows how the pump capacitor of the sixth embodiment is formed.

Referring to FIG. 20, in the configuration of the sixth embodiment, pump capacitor 32 in the charge pump circuit is implemented by parallel connection of a capacitor Ca# between nodes N1 and N2 and capacitors Cb# and Cc# connected in series to nodes N1 and N2. Further, these capacitors Ca#-Cc# are configured similarly to capacitors Ca-Cc respectively shown in FIG. 19.

Figure 21:
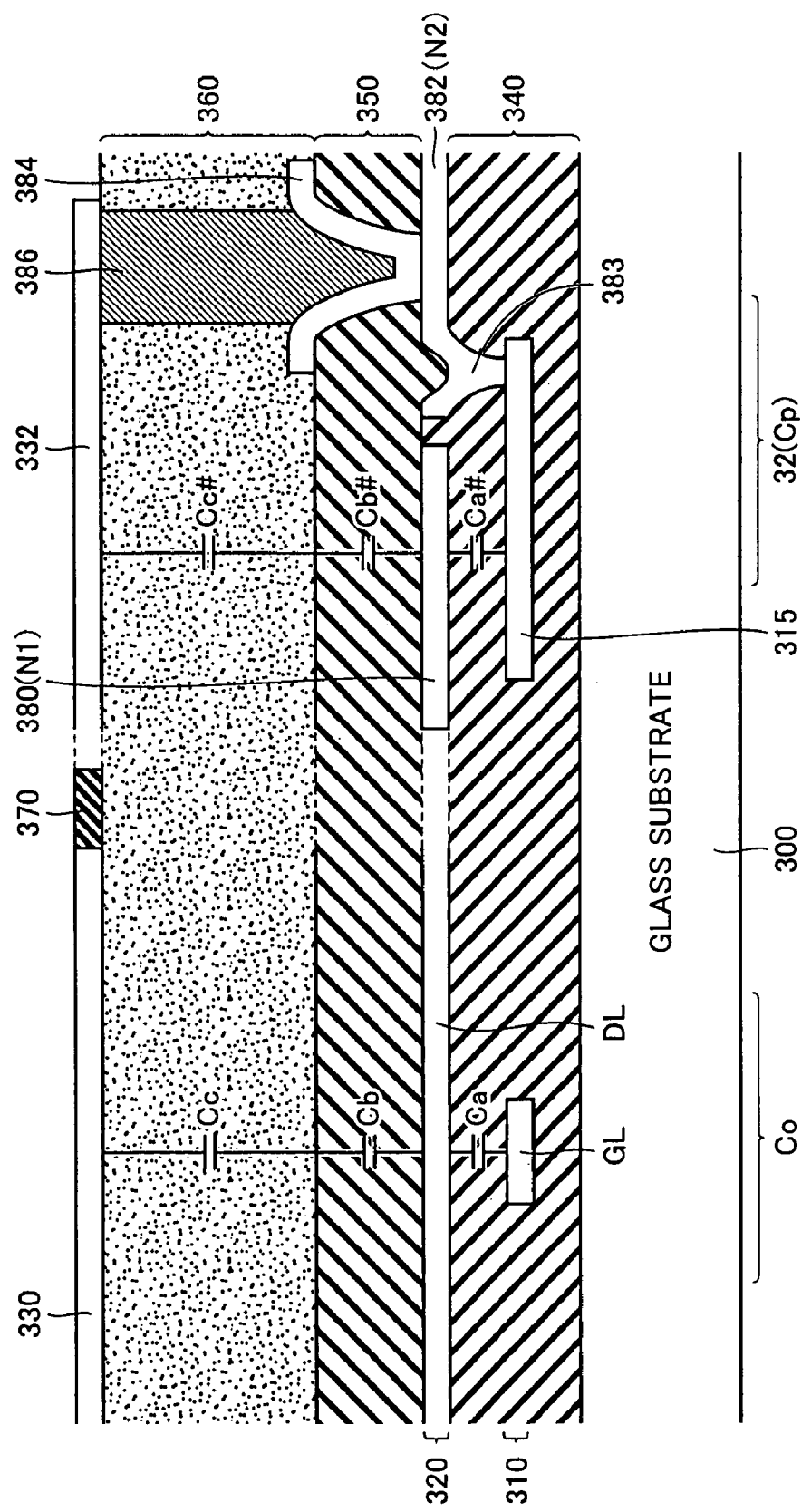
FIGS. 21 and 22 show first and second exemplary configurations respectively of pump capacitors according to the sixth embodiment.

FIG. 21 shows a first exemplary configuration of the pump capacitor of the sixth embodiment.

Referring to FIG. 21, in the region where pump capacitor 32 is formed, insulating layers 340 and 350 and liquid-crystal layer 360 are formed as the region where data line DL is provided (liquid-crystal panel unit 220 in FIG. 17). Then, pump capacitor 32 is formed between electrodes 380 and 382 corresponding respectively to nodes N1 and N2 formed in metal interconnection layer 320 where data line DL is also provided. Preferably, electrodes 380 and 382 are each made of the same material as that of data line DL.

Pump capacitor 32 includes capacitors Ca#-Cc# configured similarly to capacitors Ca-Cc constituting the output capacitor. In order to form capacitor Ca#, a dummy electrode 315 is formed in metal interconnection layer 310 where gate line GL is also formed so that dummy electrode 315 is opposite to electrode 380 with insulating layer 340 therebetween. Further, dummy electrode 315 is connected electrically to electrode 382 by a contact 383 formed in a through hole provided in insulating layer 340.

In the layer where common electrode 330 is provided, a dummy electrode 332 is formed opposite to electrode 380 with insulating layer 350 and liquid-crystal layer 360 therebetween. Then, between dummy electrode 332 and electrode 380, series-connected capacitors Cb# and Cc# corresponding respectively to parasitic capacitances of insulating layer 350 and liquid-crystal layer 360 are present.

Further, electrode 382 is connected to dummy electrode 332 by a contact electrode 384 and a conductive resin 386 constituting a contact portion formed in the through hole provided in insulating layer 350 and liquid-crystal layer 360. Contact electrode 384 is formed of an aluminum or ITO (Indium-Tin-Oxide) film. Dummy electrode 332 and contact electrode 384 are connected by pressure with conductive resin 386. Further, dummy electrode 332 is electrically disconnected by an insulating film 370 from at least common electrode 330.

With this configuration, pump capacitor 32 is formed between electrodes 380 and 382 by combination of capacitors Ca#-Cc#, like the parasitic capacitor of data line DL (i.e., output capacitor of the charge pump circuit). Respective areas of dummy electrodes 315 and 332 and electrodes 380 and 382 are designed so that the synthetic capacitance of capacitor components Ca#-Cc#, namely "Ca#+Cb#·Cc#/(Cb#+Cc#)" is equal to capacitance Cp.

With the above-described configuration, the pump capacitor is provided to allow capacitance Cp of the pump capacitor and capacitance Co of the output capacitor to have the same temperature dependencies. Then, even if capacitances Cp and Co in Equations (1) and (4) for example have temperature dependencies, the temperature dependencies cancel out by the ratio of Co/Cp, and thus the levels of voltages V2 and VB, namely the level of output voltage VNo does not have a large degree of temperature dependency. In this way, the temperature dependency can be eliminated to generate a gray-level voltage precisely by using the charge pump circuit.

Figure 22:
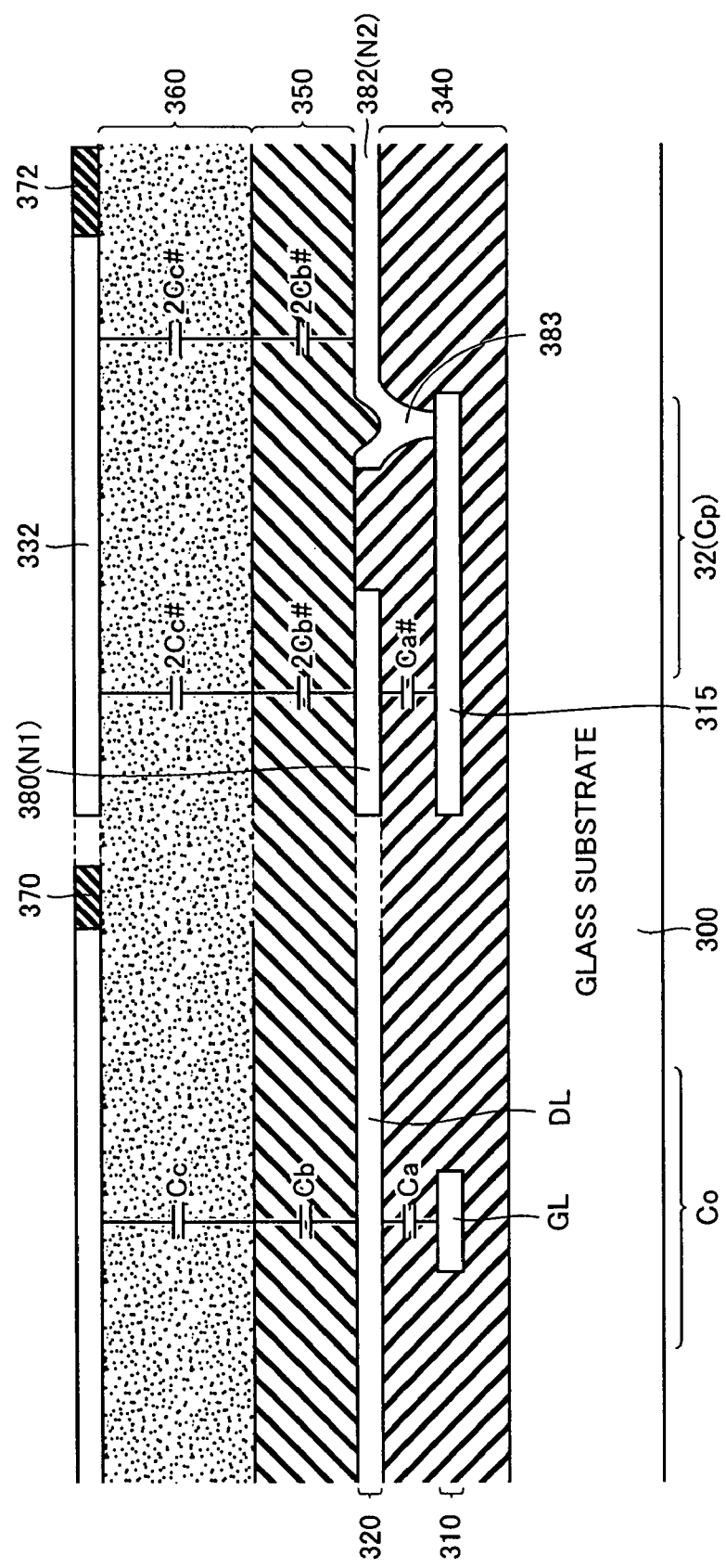

FIG. 22 shows a second exemplary configuration of a pump capacitor of a sixth embodiment.

Referring to FIG. 22 as compared with FIG. 21, in the second exemplary configuration, a dummy electrode 332 is formed in the layer where common electrode 330 is formed so that dummy electrode 332 is opposite to both of electrodes 380 and 382 with insulating layer 350 and liquid-crystal layer 360 therebetween. Further, there is no electrical contact between dummy electrode 332 and electrode 382. In other words, there is no contact electrode 384 and conductive resin 386 shown in FIG. 21. In addition, an insulating film 372 for electrically disconnecting dummy electrode 332 from other nodes and interconnections for example is provided as required, since dummy electrode 332 should be in an electrically floating state.

Thus, between electrodes 380 and 382 and dummy electrode 332, capacitor 2Cb# that is a parasitic capacitance of insulating layer 350 and capacitor 2Cc# that is a parasitic capacitance of liquid-crystal display 360 are connected in series, and these series-connected capacitors are connected in parallel. These capacitors 2Cb# and 2Cc# are twice as large as capacitors Cb# and Cc# shown in FIG. 21 in capacitance.

Between electrode 380 and dummy electrode 315, capacitor Ca# is formed to have the same configuration as that of FIG. 21.

Accordingly, the capacitor value between electrodes 380 and 382, namely between nodes N1 and N2, is Ca#+Cb#·Cc#/(Cb#+Cc#), which is the same as that of the exemplary configuration shown in FIG. 21. The pump capacitor of the charge pump circuit and the output capacitor can be configured similarly as shown in FIG. 21 to eliminate the temperature dependency and generate a gray-level voltage precisely. Further, regarding the exemplary configuration shown in FIG. 22, the attachment by pressure with the conductive resin having low dimensional accuracy is unnecessary, so that production can be facilitated and improvement of the yield can be expected.

Seventh Embodiment

According to a seventh embodiment, a description is given regarding a configuration of a display device that can speedily generate a gray-level voltage on data line DL.

Figure 23:
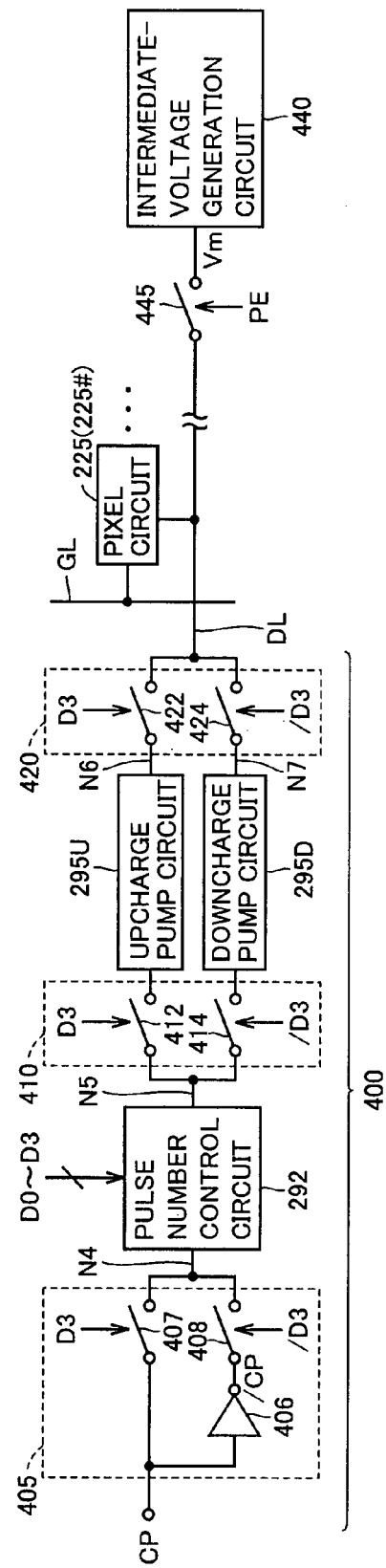
FIG. 23 is a block diagram showing a first exemplary configuration of a gray-level voltage generation circuit according to a seventh embodiment.

Referring to FIG. 23, a gray-level voltage generation circuit 400 of the seventh embodiment includes a pulse control unit 405, a pulse number control circuit 292, switch units 410 and 420, an increasing-type charge pump circuit (hereinafter upcharge pump circuit) 295U and a decreasing-type charge pump circuit (hereinafter downcharge pump circuit) 295D.

Pulse control unit 405 includes an inverter 406 inverting pulse CP to output an inverted pulse /CP and switches 407 and 408 that are complementarily turned on/off in response to data bit D3 of the most significant digit.

Pulse number control circuit 292 receives pulse CP or inverted pulse/CP transmitted to a node N4 by pulse control unit 405 to output pulses CP or inverted pulses/CP of a number according to data bits D0-D3 to a node N5.

Switch unit 410 includes a switch 412 provided between node N5 and upcharge pump circuit 295U and a switch 414 provided between node N5 and downcharge pump circuit 295D. Switch unit 420 includes a switch 422 provided between an output node of upcharge pump circuit 295U and data line DL and a switch 424 provided between an output node of downcharge pump circuit 295D and data line DL.

In generating a gray-level voltage, switches 412 and 422 are turned on when data bit D3 is "1" and turned off when data bit D3 is "0". According to data bit D3, switches 414 and 424 are turned on/off complementarily to switches 412 and 422.

Each time one pulse CP is input, upcharge pump circuit 295U increases a voltage on the output node by ΔV in a stepwise manner. In other words, as upcharge pump circuit 295U, any of upcharge pump circuits 30 and 131-133 described in connection with the first to third embodiments and respective modifications may be employed.

Each time one inverted pulse /CP is input, downcharge pump circuit 295D decreases a voltage on the output node by ΔV in a stepwise manner. In other words, as downcharge pump circuit 295D, any of charge pump circuits 30# and 131#-133# described in connection with the fourth embodiment may be used.

Alternatively, depending on the precision with which a required gray-level voltage is set and the circuit area, a charge pump circuit of a common configuration that has no bias circuit as described in connection with the first to fifth embodiments and respective modifications may be used as charge pump circuits 295U and 295D each.

To data line DL, a pixel circuit 225 (or 225#) corresponding to a selected gate line GL is connected as described in connection with FIG. 17.

Further, for data line DL, an intermediate-voltage generation circuit 440 and a precharge switch 445 connecting intermediate-voltage generation circuit 440 and data line DL in response to a precharge signal PE are provided.

Intermediate-voltage generation circuit 440 generates an intermediate voltage Vm between high voltage VDH and low voltage VDL corresponding respectively to the maximum and minimum levels of the gray-level voltage. More specifically, supposing that high voltage VDH is a gray-level voltage corresponding to (D3, D2, D1, D0)=(1, 1, 1, 1) and low voltage VDL is a gray-level voltage corresponding to (D3, D2, D1, D0)=(0, 0, 0, 0), precharge voltage Vm is set to a gray-level voltage corresponding to the intermediate level (D3, D2, D1, D0)=(1, 0, 0, 0).

In response to precharge signal PE, precharge switch 445 is turned on before a gray-level voltage is generated so as to precharge data line DL to intermediate voltage Vm. Precharge switch 445 is turned off when the gray-level voltage is generated, namely at the timing when charge pump circuit 295U or 295D is connected by switch unit 420 to data line DL.

Figure 24:
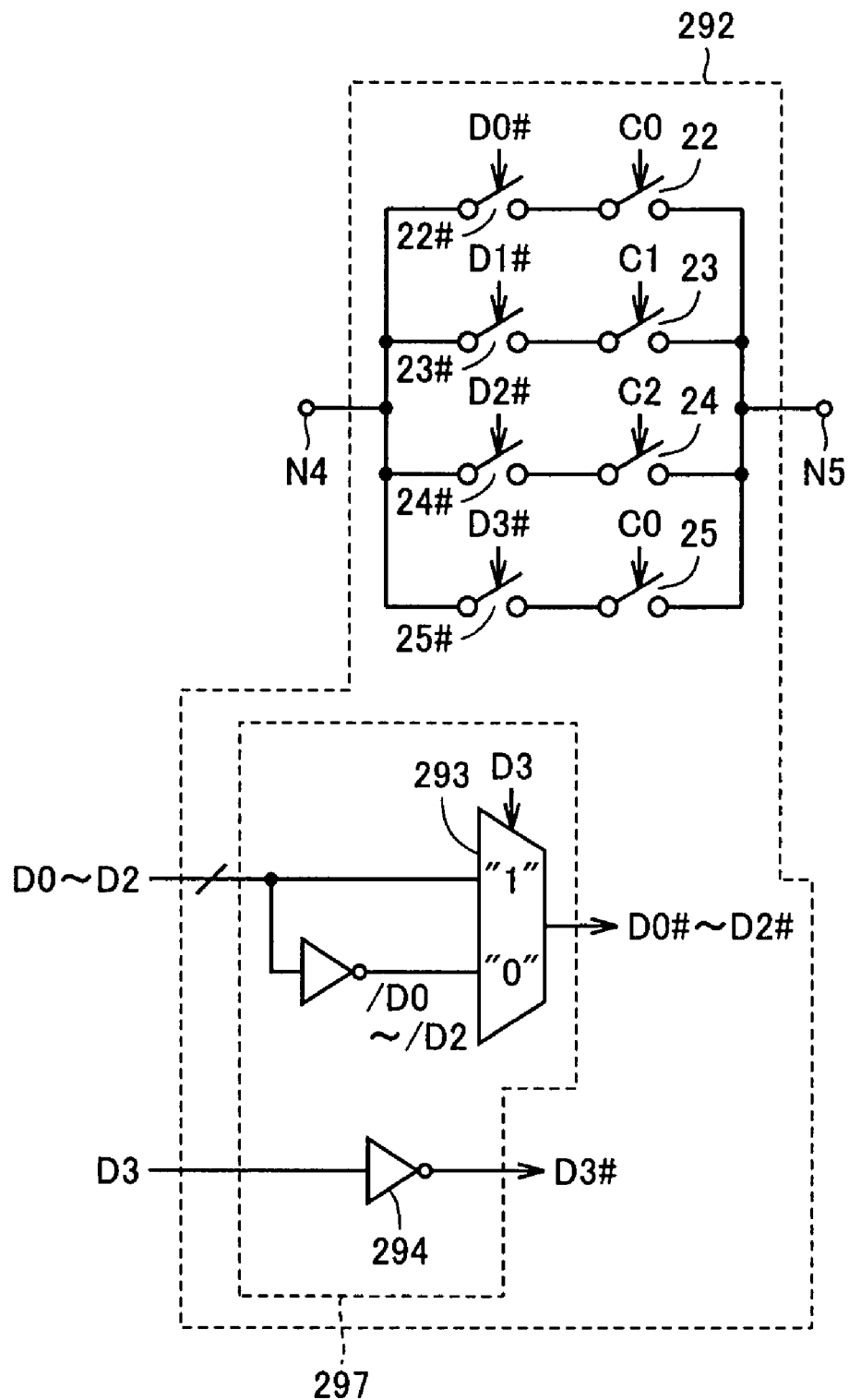
FIG. 24 is a circuit diagram showing a configuration of a pulse number control circuit shown in FIG. 23.

FIG. 24 is a circuit diagram showing a configuration of pulse number control circuit 292 shown in FIG. 23.

Referring go FIG. 24, pulse number control circuit 292 differs from pulse number control circuit 20# shown in FIG. 6 in that the former includes a switch control circuit 297 instead of switch control circuit 27#. Switch elements 22-25 and 22#-25# are provided for controlling connection between nodes N4 and N5. Switch elements 22#-25# are turned on/off in response to respective control signals D0#-D3# from switch control circuit 297. Switch elements 22-24 are turned on/off in response to respective control signals C0-C2 and switch element 25 is turned on/off in response to control signal C0.

Switch control circuit 297 includes a multiplexer 293 that outputs control signals D0#-D2#, and an inverter 294 that outputs control signal D3#. Multiplexer 293 receives data bits D0-D2 and data bits /D0-/D2 inverted by the inverter and outputs, when data bit D3 is "1", data bits D0-D2 as control signals D0#-D2# while outputs, when data bit D3 is "0", inverted data bits /D0-/D2 as control signals D0#-D2#. Inverter 294 outputs inverted data bit /D3 as control signal D3#.

Referring again to FIG. 23, when data bit D3 is "1", pulses CP are output from pulse control unit 405 to node N4. Pulse number control circuit 292 generates control signals D0#-D3# with the configuration shown in FIG. 24 so that pulses CP of a number corresponding to a difference between a gray-level voltage to be generated and intermediate voltage Vm are transmitted to node N5.

Pulses CP transmitted to node N5 are input via switch 412 to charge pump circuit 295U. The output node N6 of charge pump circuit 295U is connected by switch 422 to data line DL. No inverted pulse /CP is input to charge pump circuit 295D and the output node N7 thereof is disconnected from data line DL. As a result, the voltage on data line DL, namely gray-level voltage, increases from intermediate voltage Vm to a voltage corresponding to data bits D0-D3 according to the number of pulses CP that are input to charge pump circuit 295U.

On the other hand, when data bit D3 is "0", inverted pulses /CP are output from pulse control unit 405 to node N4. Pulse number control circuit 292 generates control signals D0#-D3# so that inverted pulses /CP of a number corresponding to a difference between a gray-level voltage to be generated and intermediate voltage Vm are transmitted to node N5.

Inverted pulses /CP transmitted to node N5 are input to charge pump circuit 295D via switch 414. The output node N7 of charge pump circuit 295D is connected by switch 424 to data line DL. No pulse CP is input to charge pump circuit 295U and its output node N6 is disconnected from data line DL. As a result, the voltage on data line DL (gray-level voltage) decreases from intermediate voltage Vm to a voltage corresponding to data bits D0-D3 according to the number of inverted pulses /CP input to charge pump circuit 295D.

In this way, with the configuration of the seventh embodiment, data line DL is precharged to intermediate voltage Vm and thereafter the upcharge pump circuit and the downcharge pump circuit are selectively operated to generate a gray-level voltage. Thus, as compared with the configuration in which only one of the upcharge pump circuit and the downcharge pump circuit is employed, the gray-level voltage can be generated more speedily.

Modification of the Seventh Embodiment

Figure 25:
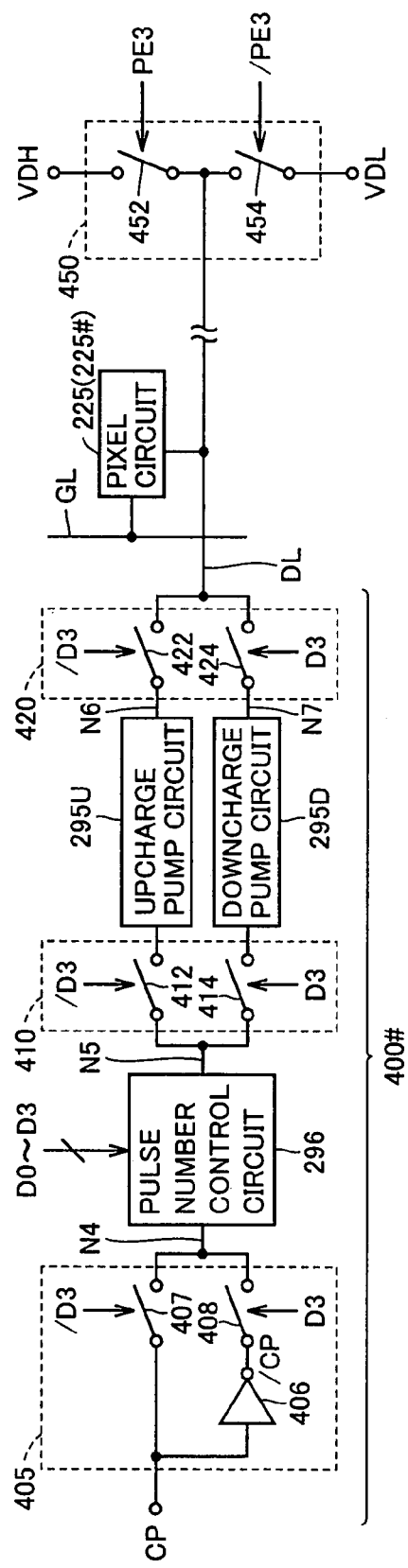
FIG. 25 is a block diagram showing an exemplary configuration of a gray-level voltage generation circuit according to a modification of the seventh embodiment.

FIG. 25 is a circuit diagram showing an exemplary configuration of a gray-level voltage generation circuit according to a modification of the seventh embodiment.

Referring to FIG. 25, the configuration of the modification of the seventh embodiment differs from the that of the seventh embodiment shown in FIG. 23 in that the former includes a gray-level voltage generation circuit 400# instead of gray-level voltage generation circuit 400 and includes a precharge circuit 450 instead of intermediate-voltage generation circuit 440 and precharge switch 445.

Precharge circuit 450 includes a switch 452 provided between high voltage VDH and data line DL and a switch 454 provided between data line DL and low voltage VDL. In response to signals PE3 and /PE3 respectively, switches 452 and 454 are complementarily turned on/off according to data bit D3 in the period during which precharge switch 445 shown in FIG. 23 is turned on.

Gray-level voltage generation circuit 400# differs from gray-level voltage generation circuit 400 shown in FIG. 23 in that the former includes a pulse number control circuit 296 instead of pulse number control circuit 292. Further, switches 407, 412, 422 and switches 408, 414, 424 are turned on/off in the opposite manner to those of gray-level voltage generation circuit 400. Specifically, when data bit D3 is "1", switches 407, 412 and 422 are each turned off while switches 408, 414 and 424 are each turned on. When data bit D3 is "0", switches 407, 412 and 422 are each turned on while switches 408, 414 and 424 are each turned off.

Figure 26:
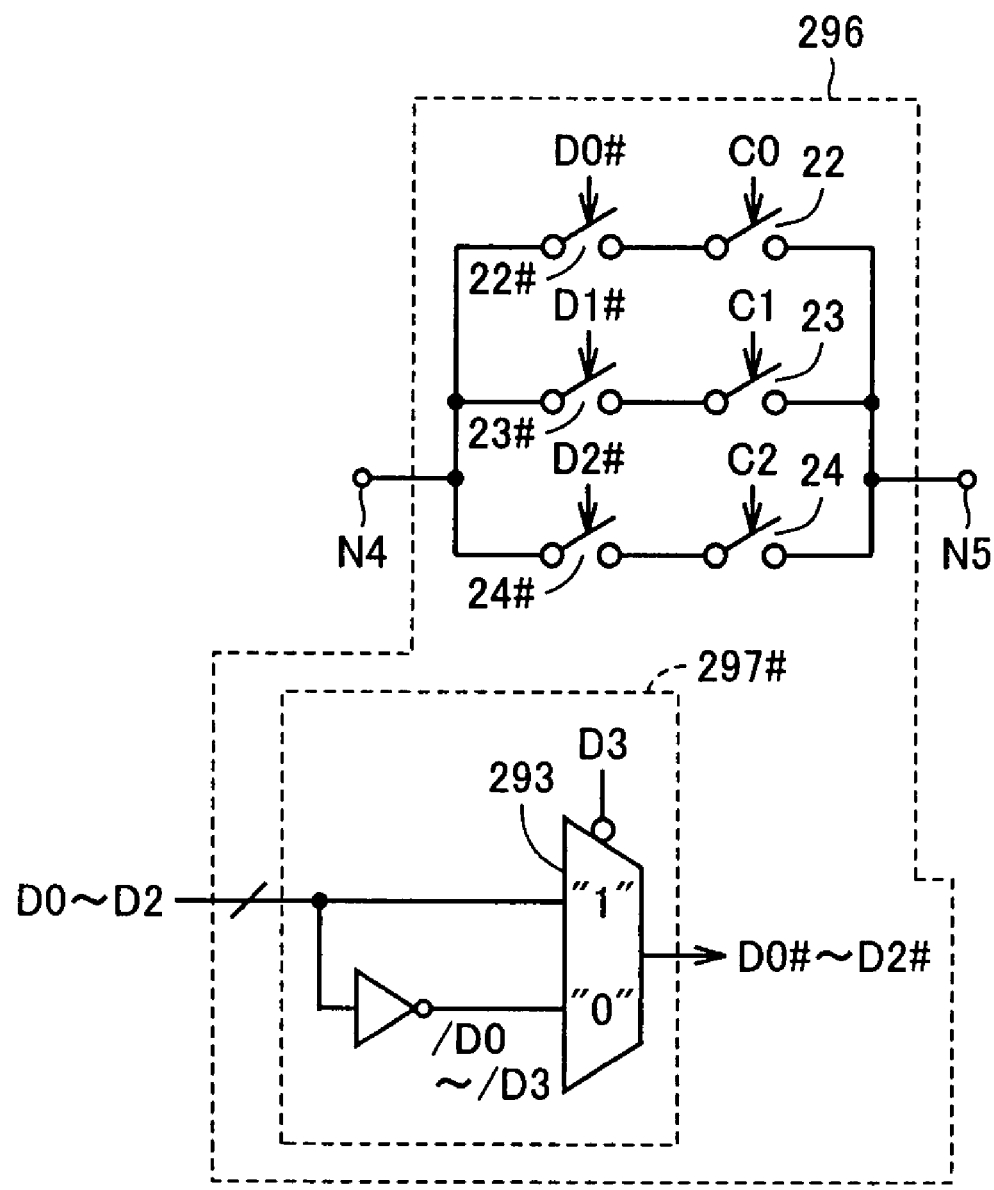
FIG. 26 is a circuit diagram showing a configuration of a pulse number control circuit shown in FIG. 25.

FIG. 26 is a circuit diagram showing a configuration of pulse number control circuit 296 shown in FIG. 25.

Referring to FIG. 26, pulse number control circuit 296 differs from pulse number control circuit 292 shown in FIG. 24 in that the former does not require arrangement of switch elements 25 and 25# for data bit D3 and includes a switch control circuit 297# instead of switch control circuit 297.

Switch control circuit 297# includes a multiplexer 293 generating control signals D0#-D2#. In the opposite manner to that shown in FIG. 24, multiplexer 293 outputs inverted data bits /D0-/D2 as control signals D0#-D2# when data bit D3 is "1" and outputs data bits D0-D2 as control signals D0#-D2# when data bit D3 is "0".

Switches 22#-24# are turned on/off in response to respective control signals D0#-D2# from switch control circuit 297# and switches 22-24 are turned on/off in response to respective control signals C0-C2.

Referring again to FIG. 25, when data bit D3 is "1", precharge circuit 450 precharges data line DL to high voltage VDH before a gray-level voltage is generated. In this state, pulse control unit 405 outputs inverted pulses /CP to node N4. Pulse number control circuit 296 generates control signals D0#-D2# with the configuration shown in FIG. 26 to transmit to output node N5 inverted pulses /CP of a number corresponding to a difference between a gray-level voltage to be generated and high voltage VDH.

Inverted pulses /CP transmitted to node N5 are input to charge pump circuit 295D via switch 414. The output node N7 of charge pump circuit 295D is connected to data line DL by switch 424. No pulse CP is input to charge pump circuit 295U and its output node N6 is disconnected from data line DL. Then, the voltage on data line DL (gray-level voltage) decreases from high voltage VDH to a voltage corresponding to data bits D0-D3 according to the number of inverted pulses /CP input to charge pump circuit 295D.

When data bit D3 is "0", precharge circuit 450 precharges data line DL to low voltage VDL before a gray-level voltage is generated. In this state, pulse control unit 405 outputs pulses CP to node N4. Pulse number control circuit 296 generates control signals D0#-D2# so that pulses CP of a number corresponding to a difference between a gray-level voltage to be generated and low voltage VDL are transmitted to node N5.

Pulses CP transmitted to node N5 are input via switch 412 to charge pump circuit 295U. The output node N6 of charge pump circuit 295U is connected by switch 422 to data line DL. No inverted pulse /CP is input to charge pump circuit 295D and its output node N7 is disconnected from data line DL. Accordingly, the voltage on data line DL (gray-level voltage) is increased from low voltage VDL to a voltage corresponding to data bits D0-D3 according to the number of pulses CP input to charge pump circuit 295U.

As discussed above, with the configuration of the modification of the seventh embodiment, a combination of the upcharge pump circuit and the downcharge pump circuit can be used to generate a gray-level voltage and change a precharge voltage on a data line according to a specified bit of display data. Thus, as compared with the configuration of the seventh embodiment, the gray-level voltage can be generated more speedily.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A display device displaying a gray level based on display data constituted of weighted n bits where n is an integer of at least two, comprising:
    a plurality of pixel circuits each indicating a brightness according to a supplied voltage;
    a selection line for selecting said plurality of pixel circuits;
    a data line connected to said plurality of pixel circuits;
    and a gray-level voltage generation circuit for supplying to said data line a gray-level voltage that is an analog voltage according to said display data,
    said gray-level voltage generation circuit including
    a pulse number control circuit supplying, to a first node, pulses of a number according to said display data, said pulses including a first transition edge changing from an initial level to a predetermined level and a second transition edge returning from said predetermined level to said initial level and
    a charge pump circuit changing, in a stepwise manner, each time one of said pulses is supplied to said first node, a voltage on an output node connected to said data line.

2. The display device according to claim 1, wherein
    said charge pump circuit includes
    a pump capacitor connected between a second node and said first node,
    a switch element connected between said second node and said output node to be turned on at a timing at which said first transition edge of each of said pulses is transmitted to said first node and turned off at a timing at which said second transition edge thereof is transmitted to said first node and
    a bias circuit changing, according to the change of the voltage on said output node, a voltage on said second node with the same polarity as that of the change of the voltage on said output node.

3. The display device according to claim 1, wherein
    said charge pump circuit includes a pump capacitor for transmitting by capacitive coupling a voltage change on said first node caused upon said pulse is supplied, and
    said pump capacitor is formed to have a similar configuration to that of a parasitic capacitance of said data line.

4. The display device according to claim 3, wherein
    said pixel circuits each include a liquid-crystal element connected between a common electrode and a pixel node connected to said data line according to a state of said selection line,
    a first insulating layer and a liquid-crystal layer having said liquid-crystal element formed therein are deposited between a first metal interconnection layer having said data line provided therein and a layer having said common electrode formed therein, a second insulating layer is present between a second metal interconnection layer having said selection line provided therein and said first metal interconnection layer, said pump capacitor includes a first electrode and a second electrode provided in said first metal interconnection layer, a first dummy electrode formed in the layer in which said common electrode is formed in such a manner that said first dummy electrode is opposite to said first electrode with said liquid-crystal layer and said first insulating layer therebetween, a second dummy electrode formed in said second metal interconnection layer in such a manner that said second dummy electrode is opposite to said first electrode with said second insulating layer therebetween, a first contact portion formed in a through hole provided in said liquid-crystal layer and said first insulating layer for electrically connecting said first dummy electrode and said second electrode, and a second contact portion formed in a through hole provided in said second insulating layer for electrically connecting said second dummy electrode and said second electrode, and said pump capacitor has its capacitance represented by a synthetic capacitance value between said first electrode and said second electrode.

5. The display device according to claim 3, wherein said pixel circuits each include a liquid-crystal element connected between a common electrode and a pixel node connected to said data line according to a state of said selection line, a first insulating layer and a liquid-crystal layer having said liquid-crystal element formed therein are deposited between a first metal interconnection layer having said data line provided therein and a layer having said common electrode formed therein, a second insulating layer is present between a second metal interconnection layer having said selection line provided therein and said first metal interconnection layer, said pump capacitor includes a first electrode and a second electrode provided in said first metal interconnection layer, a first dummy electrode formed in the layer in which said common electrode is formed in such a manner that said first dummy electrode is opposite to both of said first electrode and said second electrode with said liquid-crystal layer and said first insulating layer therebetween, a second dummy electrode formed in said second metal interconnection layer in such a manner that said second dummy electrode is opposite to said first electrode with said second insulating layer therebetween, an insulating film for allowing said second dummy electrode to stay in an electrically floating state, and a contact portion formed in a through hole provided in said second insulating layer for electrically connecting said second dummy electrode and said second electrode, and said pump capacitor has its capacitance represented by a synthetic capacitance between said first electrode and said second electrode.

6. The display device according to claim 1, wherein said pixel circuits each include a current-driven type light-emitting element indicating a brightness according to a supplied current and a current-driving unit supplying to said current-driven type light-emitting element a current according to said gray-level voltage supplied from said data line.

* * * * *